(12) United States Patent  
Eom et al.

(10) Patent No.: US 10,396,168 B2
(45) Date of Patent: Aug. 27, 2019

(54) SEMICONDUCTOR DEVICE AND MANUFACTURING METHOD THEREOF

(71) Applicant: SK hynix Inc., Icheon-si Gyeonggi-do (KR)

(72) Inventors: Dae Sung Eom, Cheongju-si (KR); Jeong Sang Kang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/010,080

(22) Filed: Jun. 15, 2018

(65) Prior Publication Data

US 2019/0148505 A1    May 16, 2019

(30) Foreign Application Priority Data

Nov. 16, 2017  (KR) .......................... 10-2017-0153228

(51) Int. Cl.
*H01L 29/423* (2006.01)
*H01L 27/11582* (2017.01)

(52) U.S. Cl.
CPC .. *H01L 29/42344* (2013.01); *H01L 27/11582* (2013.01)

(58) Field of Classification Search
CPC .................. H01L 29/42344; H01L 27/11582
See application file for complete search history.

(56) References Cited

U.S. PATENT DOCUMENTS

| 8,878,277 | B2 * | 11/2014 | Lee ................... H01L 29/66833 257/314 |
| 9,324,732 | B2 * | 4/2016 | Oh ..................... H01L 27/11582 |
| 9,818,865 | B2 * | 11/2017 | Lee ..................... H01L 29/7827 |
| 2012/0273865 | A1 * | 11/2012 | Lee ................... H01L 27/11582 257/316 |

FOREIGN PATENT DOCUMENTS

KR   1020160048505 A   5/2016
KR   1020160138883 A   12/2016

* cited by examiner

*Primary Examiner* — Mark W Tornow
(74) *Attorney, Agent, or Firm* — William Park & Associates Ltd.

(57) ABSTRACT

There are provided a semiconductor device and a manufacturing method thereof. The semiconductor device includes a pipe gate stack structure in which a portion of a first channel layer is buried. The semiconductor device includes the pipe gate stack structure in which a portion of a second channel layer is buried. The semiconductor device configured to individually control the first and second channel layers.

24 Claims, 12 Drawing Sheets

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2017-0153228 filed on Nov. 16, 2017, in the Korean Intellectual Property Office, the entire disclosure of which is incorporated herein by reference.

BACKGROUND

1. Technical Field

An aspect of the present disclosure may generally relate to a semiconductor device and a manufacturing method thereof, and particularly, to a three-dimensional memory device and a manufacturing method thereof.

2. Related Art

A three-dimensional memory device includes memory cells capable of storing data. The memory cells of the three-dimensional memory device are arranged on a horizontal plane extending in first and second directions intersecting each other, and are stacked along a third direction perpendicular to the horizontal plane. The three-dimensional memory device may have a structure that is advantageous for a high degree of integration of a semiconductor device within a limited area. In order to further improve the degree of integration of memory cells, a three-dimensional memory device having various structures is proposed. Operational characteristics of the three-dimensional memory device may be degraded due to structural features of the three-dimensional memory device. Accordingly, various techniques for preventing the degradation of operational characteristics of the three-dimensional memory device are required.

SUMMARY

According to an aspect of the present disclosure, there is provided a semiconductor device. The semiconductor device may include a first pipe gate, a second pipe gate disposed on the first pipe gate, an inter-gate insulating layer disposed between the first pipe gate and the second pipe gate, first memory cells and second memory cells. The first memory cells and the second memory cells are disposed on the second pipe gate. The semiconductor device may include a first channel layer extending toward the first memory cells from the inside of the first pipe gate and a second channel layer extending toward the second memory cells from the inside of the second pipe gate. The first channel layer connects the first memory cells in series, and the second channel layer connects the second memory cells in series. The semiconductor device may include a first contact structure connected to the first pipe gate. The semiconductor device may include a second contact structure connected to the second pipe gate.

According to an aspect of the present disclosure, there is provided a semiconductor device. The semiconductor device may include a gate stack structure including a lower conductive layer, an insulating layer, and an upper conductive layer, which are sequentially staked in a first direction. The semiconductor device may include a portion of a first channel layer buried in the lower conductive layer, the first channel layer extending in the first direction to penetrate the insulating layer and the upper conductive layer. The semiconductor device may include a portion of a second channel layer buried in the upper conductive layer, the second channel layer extending in the first direction to penetrate the upper conductive layer. The semiconductor device may include a cutting structure penetrating the upper conductive layer such that the upper conductive layer is separated into an auxiliary gate and a pipe gate stack structure, the pipe gate stack structure shared by the first and second channel layers. The semiconductor device may include a gate contact pattern penetrating the auxiliary gate, the gate contact pattern connecting the auxiliary gate to the lower conductive layer of the pipe gate stack structure.

According to an aspect of the present disclosure, there is provided a semiconductor device. The semiconductor device may include a gate stack structure including a lower conductive layer, an insulating layer, and an upper conductive layer, which are sequentially staked in a first direction. The semiconductor device may include a portion of a first channel layer buried in the lower conductive layer, the first channel layer extending in the first direction to penetrate the insulating layer and the upper conductive layer. The semiconductor device may include a portion of a second channel layer buried in the upper conductive layer, the second channel layer extending in the first direction to penetrate the upper conductive layer. The semiconductor device may include a peri cutting structure penetrating the gate stack structure such that the gate stack structure is separated into a peri gate and a pipe gate stack structure, the pipe gate stack structure shared by the first and second channel layers. The semiconductor device may include a peri gate contact pattern buried in the peri gate, the peri gate contact pattern connecting the lower conductive layer and the upper conductive layer of the peri gate.

According to an aspect of the present disclosure, there is provided a method of manufacturing a semiconductor device. The method may include forming a gate stack structure, wherein the gate stack structure includes a lower conductive layer, an insulating layer, and an upper conductive layer, which are sequentially stacked; forming cutting structures, wherein the cutting structures penetrate at least one of the upper conductive layer, the insulating layer, and the lower conductive layer such that the gate stack structure is separated into a pipe gate stack structure, an auxiliary gate, and a peri gate. The method may includes forming a buried conductive group, wherein the buried conductive group includes a first sacrificial conductive pattern and a second sacrificial conductive pattern, which are disposed in the pipe gate stack structure, a first gate contact pattern extending from the inside of the auxiliary gate to the inside of the lower conductive layer of the pipe gate stack structure, and a second gate contact pattern disposed in the peri gate. The method may includes removing the first sacrificial conductive pattern and the second sacrificial conductive pattern. The method may includes forming a first channel layer and a second channel layer, wherein the first channel layer is disposed in a region from which the first sacrificial conductive pattern is removed, and the second channel layer is disposed in a region from which the second sacrificial conductive pattern is removed.

According to an aspect of the present disclosure, there is provided a semiconductor device. The semiconductor device may include a pipe gate stack structure. The semiconductor device may include a first memory string including memory cells and a first pipe transistor coupled to each other in series via a first channel layer, the first pipe transistor formed at an intersection portion of the pipe gate stack structure and the first channel layer. The semiconductor device may include a second memory string including memory cells and a second pipe transistor coupled to each other in series via a second channel layer, the second pipe transistor formed at an intersection portion of the pipe gate stack structure and the second channel layer. The semiconductor device may include first and second contact structures configured to individually control the first and second pipe transistors, respectively.

DETAILED DESCRIPTION

Figure 1:
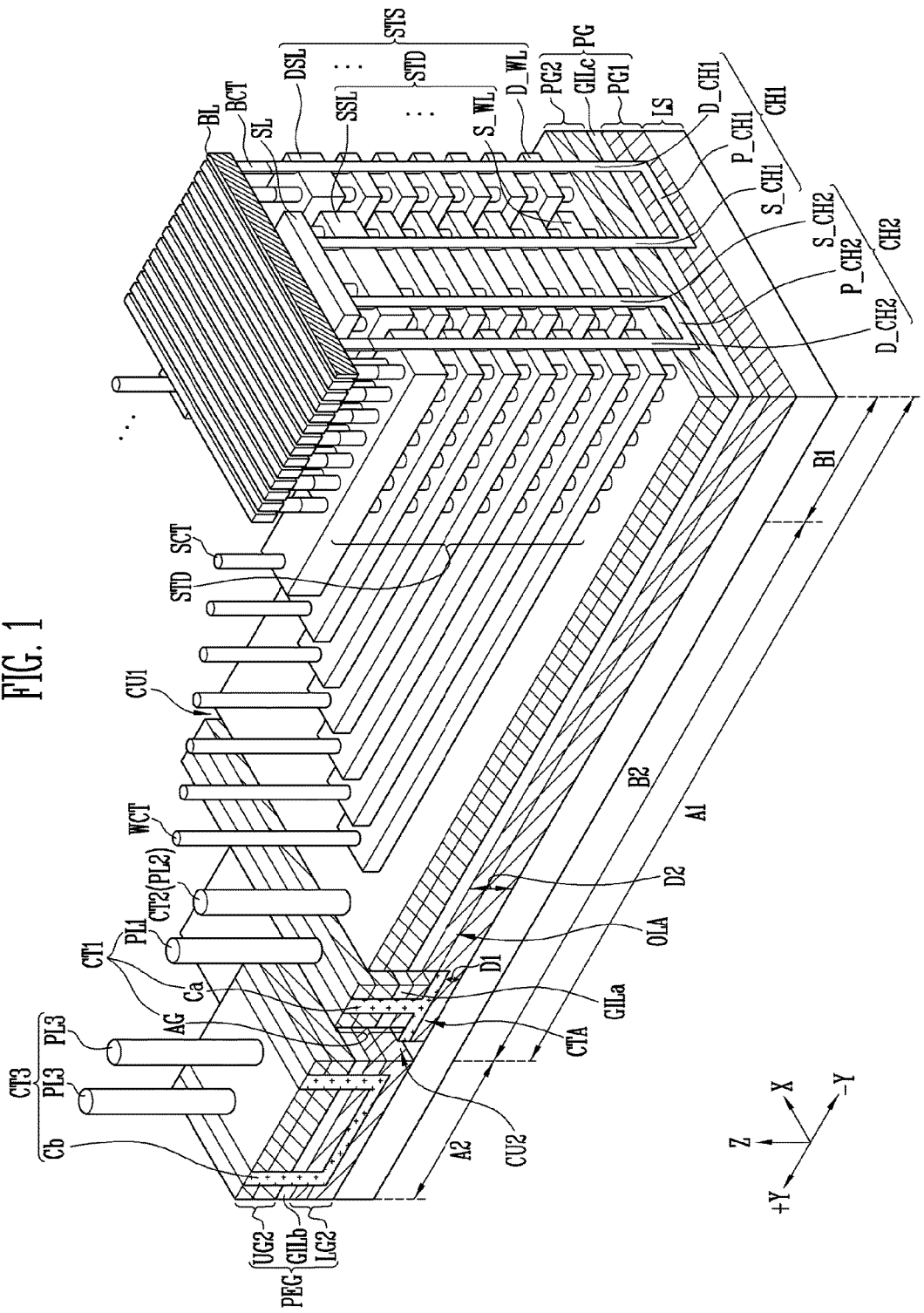
FIG. 1 shows a perspective view illustrating a semiconductor device according to an embodiment of the present disclosure.

Examples of embodiments of the present disclosure are described with reference to the accompanying drawings. The examples of embodiments, however, may be embodied in many different forms and should not be construed as being limited to the examples of embodiments set forth herein. Rather, the examples of embodiments are provided so that the present teachings are clear and enabling for those skilled in the art. The features of the present teachings may be employed in various and numerous embodiments, not all of which are presented, without departing from the scope of the present disclosure.

In the drawing figures, relative dimensions may be exaggerated for clarity of illustration. It will be understood that when an element is referred to as being "between" two elements, it can be the only element between the two elements, or one or more intervening elements may also be present. Like reference numerals refer to like elements throughout.

It is also noted that, "on" refers to one component not only directly on another component but also indirectly on another component through an intermediate component or intermediate components. On the other hand, 'directly on' refers to one component directly on another component without an intermediate component.

Embodiments provide a semiconductor device and a manufacturing method thereof, which can improve the degree of integration of memory cells and enhance operational characteristics of the semiconductor device.

FIG. 1 shows a perspective view illustrating a semiconductor device according to an embodiment of the present disclosure. For convenience of description, interlayer insulating patterns and a slit insulating layer, which are included in each of stack structures STD and STS, an insulating layer included in each of cutting structures CU1 and CU2, and insulating layers penetrated by contact structures CT1 to CT3 are not illustrated in FIG. 1.

Figure 2:
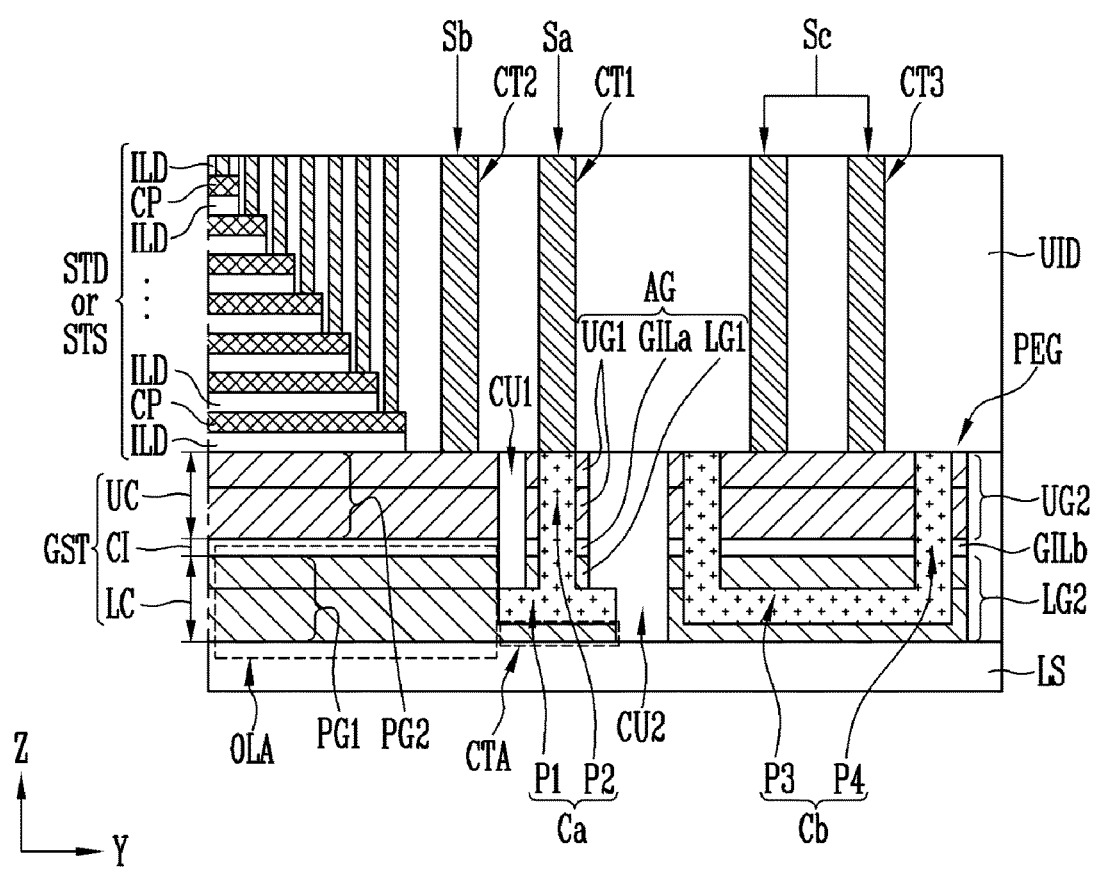
FIG. 2 shows a sectional view illustrating an interconnection region of a first region and a second region, which are shown in FIG. 1.

FIG. 2 shows a sectional view illustrating an interconnection region B2 of a first region A1 and a second region A2, which are shown in FIG. 1. FIG. 2 shows a sectional view on a Y-Z plane according to an XYZ coordinate system, which is shown in FIG. 1.

Referring to FIGS. 1 and 2, the semiconductor device according to an embodiment may include a lower structure LS including a first region A1 and a second region A2. The lower structure LS may include an insulating layer or include a peripheral circuit covered with the insulating layer. An example of a detailed structure of the lower structure LS will be described below with reference to FIG. 5.

The first region A1 is a region overlapped by gate electrodes PG1, PG2, D_WL, and S_WL of memory strings. The gate electrodes PG1, PG2, D_WL, and S_WL may be connected to contact structures CT1, CT2, WCT, and SCT for transferring driving signals. The first region A1 may include a cell array region B1 and an interconnection region B2. The interconnection region B2 is defined as a region overlapped by the contact structures CT1, CT2, WCT, and SCT. The cell array region B1 is defined as a region overlapped by channel layers CH1 and CH2 of the memory strings.

The semiconductor device according to an embodiment of the present disclosure includes a first channel layer CH1 and a second channel layer CH2, which are disposed on the cell array region B1 of the lower structure LS, a pipe gate stack structure PG for controlling at least one of the first channel layer CH1 and the second channel layer CH2, a source-side stack structure STS disposed on the pipe gate stack structure PG, and a drain-side stack structure STD spaced apart from the source-side stack structure STS, the drain-side stack structure STD being disposed on the pipe gate stack structure PG. The semiconductor device according to an embodiment of the present disclosure may further include a peri gate PEG disposed on the second region A2 of the lower structure LS. The semiconductor device according to an embodiment of the present disclosure may further include an auxiliary gate AG disposed on the first region A1 of the lower structure LS.

Each of the pipe gate stack structure PG, the auxiliary gate AG, and the peri gate PEG may be configured as a portion of a gate stack structure GST. The gate stack structure GST may include a lower conductive layer LC, an insulating layer CI, and an upper conductive layer UC, which are disposed on the lower structure LS and are sequentially stacked in a first direction (Z direction). Each of the lower conductive layer LC and an upper conductive layer UC may be formed as a conductive layer of a single layer or be formed as a conductive stack layer of two or more layers. Each of the lower conductive layer LC and an upper conductive layer UC may include at least one of a poly-silicon layer, a metal layer, and a metal silicide layer. In an embodiment of the present disclosure, the page gate stack structure PG, the auxiliary gate AG, and the peri gate PEG are formed by patterning the gate stack structure GST, so that manufacturing processes of the semiconductor device can be simplified.

The gate stack structure GST may be separated into the pipe gate stack structure PG, the auxiliary gate AG, and the peri gate PEG by cutting structures CU1 and CU2. The cutting structures CU1 and CU2 may include an auxiliary cutting structure (or first cutting structure) CU1 disposed between the pipe gate stack structure PG and the auxiliary gate AG and a peri cutting structure (or second cutting structure) CU2 disposed between the pipe gate stack structure PG and the peri gate PEG. Each of the cutting structures CU1 and CU2 may completely penetrate the upper conductive layer UC and the insulating layer CI and extend to the inside of the lower conductive layer LC. Each of the cutting structures CU1 and CU2 may be filled with an insulating material.

The lower conductive layer LC may be separated into a first pipe gate PG1 of the pipe gate stack structure PG, a first lower conductive pattern LG1 of the auxiliary gate AG, and a second lower conductive pattern LG2 of the peri gate PEG by the cutting structures CU1 and CU2. The second lower conductive pattern LG2 may be disposed on the same plane as the first pipe gate PG1.

The insulating layer CI may be separated into an inter-gate insulating layer GILc of the pipe gate stack structure PG, a first dummy insulating layer GILa of the auxiliary gate AG, and a second dummy insulating layer GILb of the peri gate PEG by the cutting structures CU1 and CU2. The first dummy insulating layer GILa and the second dummy insulating layer GILb may be disposed on the same plane as the inter-gate insulating layer GILc.

The upper conductive layer UC may be separated into a second pipe gate PG2 of the pipe gate stack structure PG, a first upper conductive pattern UG1 of the auxiliary gate AG, and a second upper conductive pattern UG2 of the peri gate PEG by cutting structures CU1 and CU2. The first upper conductive pattern UG1 and the second upper conductive pattern UG2 may be disposed on the same plane as the second pipe gate PG2.

The first lower conductive pattern LG1 of the auxiliary gate AG is disposed under the first upper conductive pattern UG1 with the first dummy insulating layer GILa interposed between the first lower conductive pattern LG1 and the first upper conductive pattern UG1.

The pipe gate stack structure PG according to an embodiment of the present disclosure includes the first pipe gate PG1, the second pipe gate PG2, and the inter-gate insulating layer GILc. The second pipe gate PG2 is disposed on the first pipe gate PG1. The inter-gate insulating layer GILc is disposed between the first pipe gate PG1 and the second pipe gate PG2. The inter-gate insulating layer GILc may not only allow the second pipe gate PG2 to be electrically separated from the first pipe gate PG1 but also allow the second pipe gate PG2 to be structurally separated from the first pipe gate PG1.

The semiconductor device according to an embodiment of the present disclosure may further include gate contact patterns Ca and Cb. The gate contact patterns Ca and Cb may include an auxiliary gate contact pattern (or first gate contact pattern) Ca and a peri gate contact pattern (or second gate contact pattern) Cb.

The auxiliary gate contact pattern Ca is in contact with the first pipe gate PG1, and is spaced apart from the second pipe gate PG2. The auxiliary gate contact pattern Ca extends to penetrate the auxiliary gate AG. The auxiliary gate contact pattern Ca, as shown in FIG. 2, may include a first vertical part P2 penetrating the auxiliary gate AG and a first horizontal part P1 extending along a lower surface of the auxiliary gate AG from the first vertical part P2. The first horizontal part P1 may be formed to have a width wider than that of the auxiliary gate AG. The auxiliary gate contact pattern Ca electrically connects the first pipe gate PG1 and the auxiliary gate AG.

The peri gate contact pattern Cb is buried in the peri gate PEG. The peri gate contact pattern Cb, as shown in FIG. 2, may include a second horizontal part P3 buried in the second lower conductive pattern LG2 and a second vertical part P4 extending from the second horizontal part P3 to penetrate the second dummy insulating layer GILb and the second upper conductive pattern UG2. The second horizontal part P3 may be formed to have a width narrower than that of the peri gate PEG. The second vertical part P4 may be disposed at both ends of the second horizontal part P3. The shapes and numbers of second horizontal parts P3 and second vertical parts P4 may be variously designed and modified. The peri gate contact pattern Cb electrically connects the second lower conductive pattern LG2 and the second upper conductive pattern UG2.

The first pipe gate PG1 of the pipe gate stack structure PG may include an overlapping region OLA overlapped by the second pipe gate PG2 and may include a contact region CTA that is not overlapped by the second pipe gate PG2. The first horizontal part P1 of the auxiliary gate contact pattern Ca may be in contact with the contact region CTA of the first pipe gate PG1, and the first vertical part P2 of the auxiliary gate contact pattern Ca may extend up to the height of a top surface of the second pipe gate PG2.

The auxiliary gate AG is disposed on the contact region CTA of the first pipe gate PG1, and is spaced apart from the second pipe gate PG2. The first horizontal part P1 extends between the auxiliary gate AG and the first pipe gate PG1. The thickness D1 of a portion of the contact region CTA of the first pipe gate PG1, which is overlapped by the first horizontal part P1, may be formed thinner than that D2 of the overlapping region OLA of the first pipe gate PG1.

The first horizontal part P1 of the auxiliary gate contact pattern Ca may protrude farther laterally than the auxiliary gate AG. The first horizontal part P1 may extend to be in contact with a sidewall of the overlapping region OLA of the first pipe gate PG1. The depth of each of the cutting structures CU1 and CU2 may be controlled such that each of the cutting structures CU1 and CU2 does not penetrate the first horizontal part P1 protruding farther laterally than the auxiliary gate AG. Accordingly, a partial surface of each of the cutting structures CU1 and CU2 forms a common surface with a top surface of the first horizontal part P1. The auxiliary cutting structure CU1 is disposed to overlap with the first horizontal part P1, and may be disposed in only a region on the first horizontal part P1. The auxiliary cutting structure CU1 may not protrude farther laterally than the first horizontal part P1. Accordingly, a portion of the lower conductive layer LC under the first horizontal part P1 remains as the first pipe gate PG1. The lower conductive layer LC of the first pipe gate PG1 extends toward the first channel layer CH1. The peri cutting structure CU2 is formed to separate the lower conductive layer LC into the first pipe gate PG1 and the second lower conductive pattern LG2 of the peri gate PEG. To this end, the peri cutting structure CU2 completely penetrates a portion of the lower conductive layer LC, which is disposed between the first horizontal part P1 and the peri gate contact pattern Cb.

The gate contact patterns Ca and Cb may be formed of a conductive material capable of serving as an etch stop layer. To this end, the gate contact patterns Ca and Cb may be formed of a conductive material different from that of the upper conductive layer UC and the lower conductive layer LC. For example, the gate contact patterns Ca and Cb may include a titanium nitride layer (TiN).

The pipe gate stack structure PG, the source-side stack structure STS, and the drain-side stack structure STD are disposed on the first region A1, and may extend from the cell array region B1 to the interconnection region B2. For convenience of description, an example in which one drain-side stack structure STD extends in a +Y direction is illustrated in FIG. 1, but another drain-side stack structure STD may extend in the +Y direction. In addition, the source-side stack structure STS may extend from the cell array region B1 to another interconnection region along a −Y direction. Each of the drain-side stack structure STD and the source-side stack structure STD may be patterned in a step structure in an interconnection region (e.g., B2).

Referring to FIG. 1, the first channel layer CH1 includes a first pipe channel P_CH1, and a first source-side channel S_CH1 and a first drain-side channel D_CH1, which protrude farther in the first direction (Z direction) than the pipe gate stack structure PG. The first pipe channel P_CH1 is buried in the first pipe gate PG1. The first source-side channel S_CH1 and the first drain-side channel D_CH1 extend from the first pipe channel P_CH1 to penetrate the inter-gate insulating layer GILc and the second pipe gate PG2. The first source-side channel S_CH1 and the first drain-side channel D_CH1 extend toward a bit line BL and a common source line SL from the first pipe channel P_CH1.

The second channel layer CH2 includes a second pipe channel P_CH2, and a second source-side channel S_CH2 and a second drain-side channel D_CH2, which protrude farther in the first direction (Z direction) than the pipe gate stack structure PG. The second pipe channel P_CH2 is buried in the second pipe gate PG2. The second source-side channel S_CH2 and the second drain-side channel D_CH2 extend in the first direction from the second pipe channel P_CH2 to penetrate the second pipe gate PG2. The second source-side channel S_CH2 and the second drain-side channel D_CH2 extend toward the bit line BL and the common source line SL from the second pipe channel P_CH2.

The second pipe channel P_CH2 is disposed at a position higher than that of the first pipe channel P_CH1, and is formed shorter than the first pipe channel P_CH1. Accordingly, in an embodiment of the present disclosure, the first pipe channel P_CH1 and the second pipe channel P_CH2 can be densely disposed as compared with pipe channels disposed at the same height with the same length. Thus, in an embodiment of the present disclosure, the degree of integration of memory cells can be improved.

Each of the first channel layer CH1 and the second channel layer CH2 may include a tubular semiconductor layer that has a central region filled with an insulating material and surround the insulating material. Alternatively, each of the first channel layer CH1 and the second channel layer CH2 may include a buried semiconductor layer that completely fills in a hole defining a region in which the channel layer is disposed from a surface of the hole to a central region of the hole. Alternatively, each of the first channel layer CH1 and the second channel layer CH2 may be formed in a structure obtained by combining the buried semiconductor layer and the tubular semiconductor layer. Although not shown in the drawings, an outer wall of each of the first channel layer CH1 and the second channel layer CH2 may be surrounded by a multi-layered memory layer of three or more layers including a tunnel insulating layer, a data storage layer, and a charge blocking layer.

The first channel layer CH1 and the second channel layer CH2 may alternately disposed in the extending direction (e.g., an X direction) of bit lines BL and directions (e.g., the +Y direction and the −Y direction) intersecting the extending direction of the bit lines BL. The first channel layer CH1 and the second channel layer CH2 may be disposed in a zigzag pattern.

The source-side stack structure STS and the drain-side stack structure STD may be separated by a slit. The separation structure of the source-side stack structure STS and the drain-side stack structure STD may be variously changed depending on the shape of the slit.

The source-side stack structure STS is penetrated by the first source-side channel S_CH1 and the second source-side channel S_CH2. The source-side stack structure STS includes source-side word lines S_WL stacked to be spaced apart from each other and at least one source select line SSL stacked above the source-side word lines S_WL. The source select line SSL may be formed to have a thickness equal to that of the source-side word lines S_WL or be formed to have a thickness thicker than that of the source-side word lines S_WL. The source select line SSL is spaced apart from the source-side word lines S_WL. The source-side word lines S_WL and the source select line SSL may extend in the +Y direction and the −Y direction while surrounding the first source-side channel S_CH1 and the second source-side channel S_CH2.

The drain-side stack structure STD is penetrated by the first drain-side channel D_CH1 and the second drain-side channel D_CH2. The drain-side stack structure STD includes drain-side word lines D_WL stacked to be spaced apart from each other and at least one drain select line DSL stacked above the drain-side word lines D_WL. The drain select line DSL is spaced apart from the drain-side word lines D_WL. Each of the drain-side word lines D_WL and the drain select line DSL may extend in the +Y direction and the −Y direction while surrounding the first drain-side channel D_CH1 and the second drain-side channel D_CH2.

The source-side stack structure STS and the drain-side stack structure STD may be formed to have the same height. The common source line SL and the bit lines BL are disposed above the source-side stack structure STS and the drain-side stack structure STD. The common source line SL and the bit lines BL are disposed to be spaced apart from each other. For example, the bit lines BL may be spaced apart from the common source line SL to be disposed above the common source line SL.

The common source line SL may be commonly connected to the first source-side channel S_CH1 and the second source-side channel S_CH2. The common source line SL may extend in the +Y direction and the −Y direction.

The bit lines BL may extend in the X direction. Each of the bit lines BL is connected to the first and second drain-side channels D_CH1 and D_CH2 arranged along the extending direction of each of the bit lines BL. The bit lines BL may be connected to the first and second drain-side channels D_CH1 and D_CH2 via bit line contact plugs BCT. Each of the bit lines BL may be connected to the first and second drain-side channels D_CH1 and D_CH2 alternately arranged in the X direction. The first and second drain-side channels D_CH1 and D_CH2 alternately arranged in the +Y direction and the −Y direction may be connected to bit lines different from each other.

Pipe transistors are formed at an intersection portion of the first pipe gate PG1 and the first channel layer CH1, an intersection portion of the second pipe gate PG2 and the first channel layer CH1, and an intersection portion of the second pipe gate PG2 and the second channel layer CH2. Memory cells are formed at intersection portion of the word lines D_WL and S_WL and the first channel layer CH1 or intersection portions of the word lines D_WL and S_WL and the second channel layer CH2. A source select transistor is formed at an intersection portion of the source select line SSL and the first channel layer CH1 or an intersection portion of the source select line SSL and the second channel layer CH2. A drain select transistor is formed at an intersection portion of the drain select line DSL and the first channel layer CH1 or an intersection portion of the drain select line DSL and the second channel layer CH2. Accordingly, a first memory string including a drain select transistor, memory cells, a pipe transistor, and a source select transistor, which are connected in series by the first channel layer CH1, is connected between one bit line BL and the source line SL. In addition, a second memory string including a drain select transistor, memory cells, a pipe transistor, and a source select transistor, which are connected in series by the second channel layer CH2, is connected between one bit line BL and the source line SL. The first memory string and the second memory string can be densely arranged according to the arrangement of the first pipe channel P_CH1 and the second pipe channel P_CH2. Accordingly, in an embodiment of the present disclosure, it is possible to improve the degree of integration of a memory device within a limited space.

Referring to FIG. 2, the source-side stack structure STS or the drain-side stack structure STD, which is shown in FIG. 1, includes interlayer insulating patterns ILD and conductive patterns CP, which are alternately stacked on the second pipe gate PG2. The conductive patterns CP may be used as the word lines D_WL or S_W and the select lines DSL or SSL, which are described in FIG. 1.

Referring to FIGS. 1 and 2, the conductive patterns CP used as the word lines D_WL or S_W and the select lines DSL or SSL may be patterned in a step structure in the interconnection region B2. The interconnection region B2 may be covered with an upper insulating layer UID as shown in FIG. 2.

The conductive patterns CP used as the word lines D_WL or S_W and the select lines DSL or SSL may be connected to contact plugs WCT and SCT penetrating the upper insulating layer UID, respectively.

The semiconductor device according to an embodiment of the present disclosure may further include first to third contact plugs PL1 to PL3.

The first contact plug PL1 is disposed on the auxiliary gate contact pattern Ca, and is in contact with the auxiliary gate contact pattern Ca. Since the auxiliary gate AG remains around the auxiliary gate contact pattern Ca, the contact area of the first contact plug PL1 can be ensured through the auxiliary gate AG. The first contact plug PL1 is a portion of a first contact structure CT1 for applying a first control signal Sa to the first pipe gate PG1. The first contact structure CT1 may include the first contact plug PL1, the auxiliary gate AG, and the auxiliary gate contact pattern Ca. The first control signal Sa applied to the first contact plug PL1 of the first contact structure CT1 may be applied to the first pipe gate PG1 via the auxiliary gate contact pattern Ca. The auxiliary gate AG may surround the auxiliary gate contact pattern Ca and decreases the resistance of the auxiliary gate contact pattern Ca. The shape of the first contact plug PL1 is not limited to the cylindrical shape shown in the drawings, and the number of first contact plugs PL1 is not limited to the number shown in the drawings. The shape and number of first contact plugs PL1 may be variously changed.

The second contact plug PL2 is a second contact structure CT2. The shape of the second contact plug PL2 is not limited to the cylindrical shape shown in the drawings, and the number of second contact plugs PL2 is not limited to the number shown in the drawings. The shape and number of second contact plugs PL2 may be variously changed. The second contact structure CT2 is disposed on the second pipe gate PG2, and is in contact with the second pipe gate PG2. A second control signal Sb applied to the second contact structure CT2 may be applied to only the second pipe gate PG2.

The third contact plug PL3 is disposed on the second upper conductive pattern UG2 of the peri gate PEG, and may be in contact with the second upper conductive pattern UG2. The third contact plug PL3 is a portion of a third contact structure CT3 for applying a third control signal Sc to the peri gate PEG. The third contact structure CT3 may include the third contact plug PL3 and the peri gate contact pattern Cb. The third control signal Sc applied to the third contact plug PL3 of the third contact structure CT3 may be applied to the peri gate PEG. The shape of the third contact plug PL3 is not limited to the cylindrical shape shown in the drawings, and the number of third contact plugs PL3 is not limited to the number shown in the drawings. The shape and number of third contact plugs PL3 may be variously changed.

According to the above-described embodiment of the present disclosure, the first to third control signals Sa to Sc different from one another can be applied to the first to third contact structures CT1 to CT3.

The first channel layer CH1 between the first channel layer CH1 and the second channel layer CH2, which are shared by the pipe gate stack structure PG, can be individually controlled by the first control signal Sa applied to the first pipe gate PG1 of the pipe gate stack structure PG. The second channel layer CH2 is insulated from the first pipe gate PG1, and is isolated from the control of the first control signal Sa.

Figure 3:
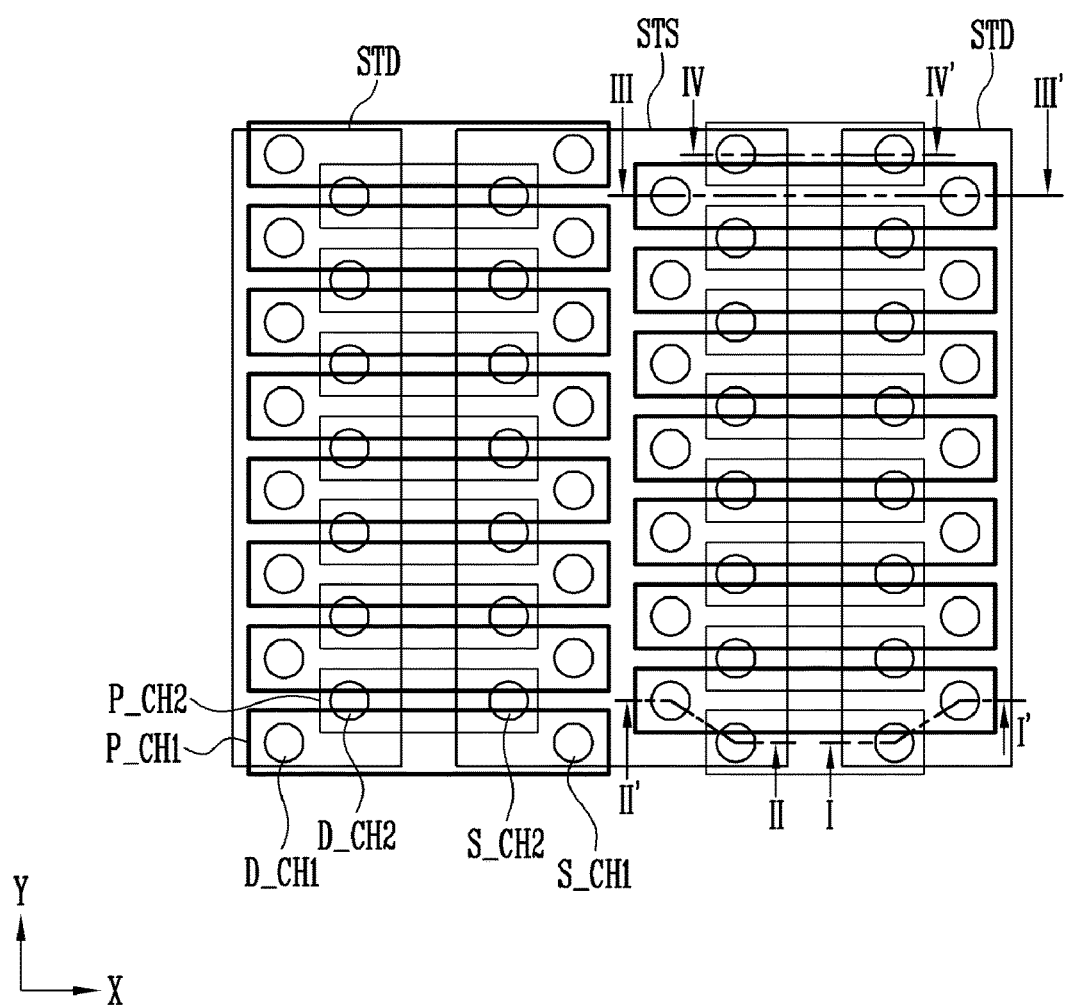
FIG. 3 shows a plan view illustrating a layout of a source-side stack structure, a drain-side stack structure, a first channel layer, and a second channel layer, which are shown in FIG. 1.

FIG. 3 shows a plan view illustrating a layout of the source-side stack structure, the drain-side stack structure, the first channel layer, and the second channel layer, which are shown in FIG. 1.

Referring to FIG. 3, first pipe channels P_CH1 and second pipe channel P_CH2 are arranged in a matrix form. The first pipe channels P_CH1 and the second pipe channel P_CH2 may be alternately arranged in the X direction. The first pipe channels P_CH1 and the second pipe channel P_CH2 may be alternately arranged in the Y direction.

The first pipe channels P_CH1 and the second pipe channel P_CH2, which are formed with different lengths and are disposed at different heights, are alternately arranged in the X direction and the Y direction. The first pipe channels P_CH1 and the second pipe channels P_CH2 can be densely disposed through the arrangement, and thus the degree of integration of the memory device can be improved. The first pipe channels P_CH1 and the second pipe channels P_CH2, which are arranged in the Y direction, may overlap with each other.

The drain-side stack structure STD extends in the Y direction while surrounding first and second drain-side channels D_CH1 and D_CH2. The source-side stack structure STS extends in the Y direction while surrounding first and second source-side channels S_CH1 and S_CH2.

The drain-side stack structure STD may surround first drain-side channels D_CH1 of at least one line and second drain-side channels D_CH2 of at least one line.

The drain-side stack structure STD and the source-side stack structure STS are spaced apart from each other.

The source-side stack structure STS may be formed to have a width wider than that of the drain-side stack structure STD. For example, the source-side stack structure STS may surround first source-side channels S_CH1 of two lines and second source-side channels S_CH2 of two lines. The layout of the first pipe channel P_CH1, the second pipe channel P_CH2, the source-side stack structure STS, and the drain-side stack structure STD is not limited to the example shown in the drawing, and may be variously modified.

Figure 4:
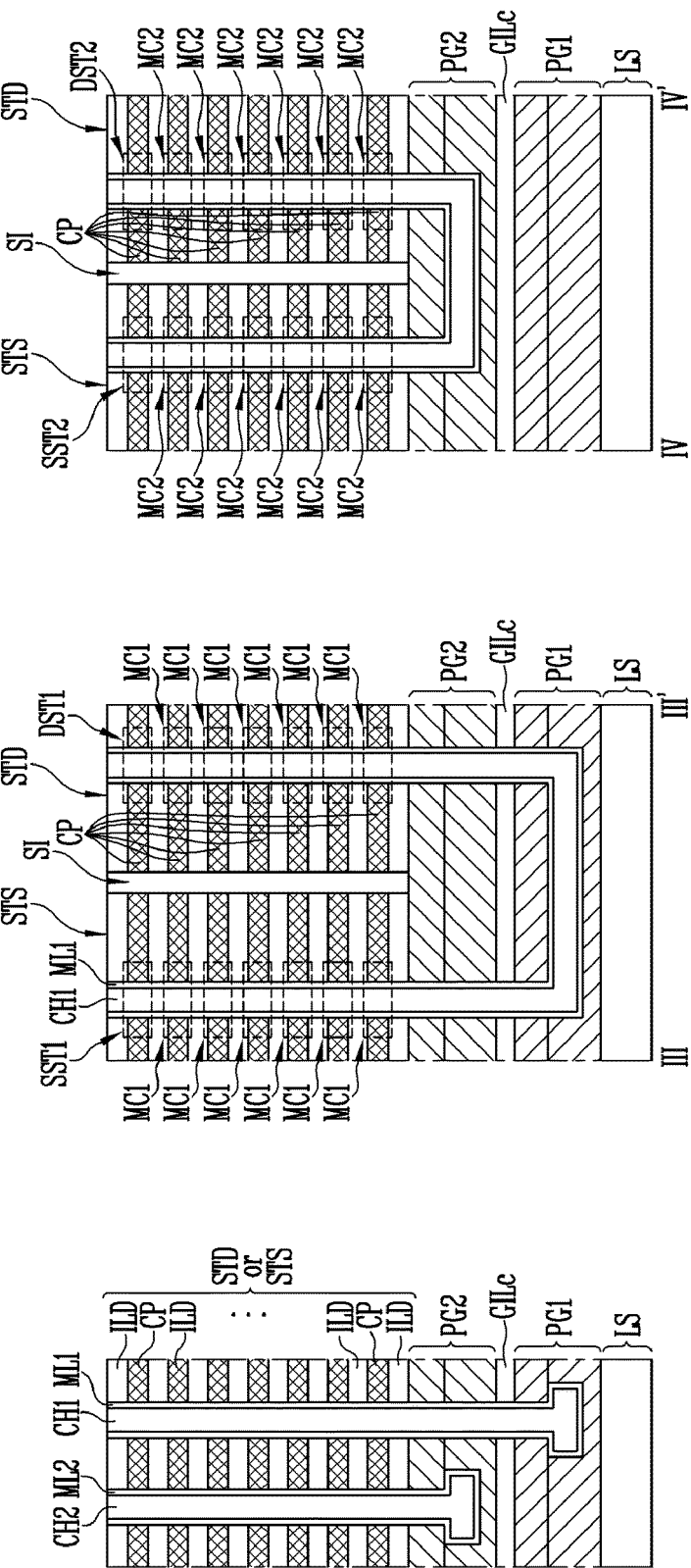
FIGS. 4A to 4C show views illustrating sections taken along lines "I-I'," "II-II," "III-III," and "IV-IV'" shown in FIG. 1.

FIGS. 4A to 4C show views illustrating sections taken along lines "I-I'," "II-II," "III-III," and "IV-IV'" shown in FIG. 1. FIG. 4A shows a sectional view taken along line "I-I'" or "II-II" shown in FIG. 3. FIG. 4B shows a sectional view taken along line "III-III" shown in FIG. 3. FIG. 4C shows a sectional view taken along line "IV-IV'" shown in FIG. 1.

Referring to FIGS. 4A to 4C, the semiconductor device according to the embodiment of the present disclosure includes a first pipe gate PG1, an inter-gate insulating layer GILc, and a second pipe gate PG2, which are sequentially stacked on a lower structure LS, as described in FIGS. 1 and 2. In addition, interlayer insulating patterns ILD and conductive patterns CP are alternately stacked on the second pipe gate PG2. The interlayer insulating patterns ILD and the conductive patterns CP may constitute a source-side stack structure STS or constitute a drain-side stack structure STD. The source-side stack structure STS and the drain-side stack structure STD are spaced apart from each other with a slit SI interposed therebetween. Outer walls of a first channel layer CH1 and a second channel layer CH2 may be surrounded by a first multi-layered memory layer MLA and a second multi-layered memory layer ML2, respectively.

Referring to FIG. 4A, the first channel layer CH1 penetrates the source-side stack structure STS or the drain-side stack structure STD and extends down to the inside of the first pipe gate PG1. The second channel layer CH2 penetrates the source-side stack structure STS or the drain-side stack structure STD and extends down to the inside of the second pipe gate PG2. A bottom surface of the second channel layer CH2 is disposed higher than that of the second pipe gate PG2. That is, the second pipe gate PG2 remains between the second channel layer CH2 and the inter-gate insulating layer GILc.

The length of the first channel layer CH1 according to the embodiment of the present disclosure is formed longer than that of the second channel layer CH2. A difference in channel current, caused by the difference in length between the first channel layer CH1 and the second channel layer CH2, can be reduced through individual control of the first control signal Sa and the second control signal Sb, which are described in FIG. 2.

Referring to FIG. 4B, first memory cells MC1, a first source select transistor SST1, and a first drain select transistor DST1 are formed at intersection portions of the conductive patterns CP disposed on the second pipe gate PG2 and the first channel layer CH1. The first channel layer CH1 extends toward the first memory cells MC1, the first source select transistor SST1, and the first drain select transistor DST1 from the inside of the first pipe gate PG1. The first channel layer CH1 connects, in series, the first memory cells MC1, the first source select transistor SST1, and the first drain select transistor DST1.

Referring to FIG. 4C, second memory cells MC2, a second source select transistor SST2, and a second drain select transistor DST2 are formed at intersection portions of the conductive patterns CP disposed on the second pipe gate PG2 and the second channel layer CH2. The second channel layer CH2 extends toward the second memory cells MC2, the second source select transistor SST2, and the second drain select transistor DST2 from the inside of the second pipe gate PG2. The second channel layer CH2 connects, in series, the second memory cells MC2, the second source select transistor SST2, and the second drain select transistor DST2.

Figure 5:
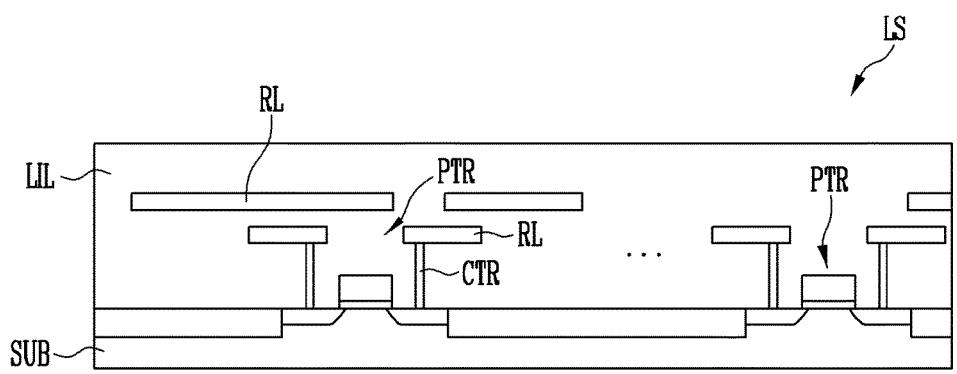
FIG. 5 shows a sectional view illustrating an example of a lower structure shown in each of FIGS. 1, 2, and 4A to 4C.

FIG. 5 shows a sectional view illustrating an example of the lower structure shown in each of FIGS. 1, 2, and 4A to 4C.

Referring to FIG. 5, the lower structure LS may include driving transistors PTR disposed on a substrate SUB to control an operation of memory strings. The driving transistors PTR may be covered with a lower insulating layer LIL. A surface of the lower insulating layer LIL may be planarized through a planarization process. The lower insulating layer LIL may be formed with multi-layered insulating layers. The driving transistors PTR may be disposed in various structures. The driving transistors PTR may be connected to the memory strings through routing lines RL and contact plugs CTR. The routing lines RL and the contact plugs CTR may be disposed in various layouts. The routing lines RL and the contact plugs CTR may be disposed in the lower insulating layer LIL.

FIGS. 6A to 6L are sectional views illustrating a manufacturing method of the semiconductor device according to an embodiment of the present disclosure. Each of FIGS. 6A to 6L illustrates sectional views of the cell array region B1, the interconnection region B2, and the second region A2, which are shown in FIG. 1. The sectional view of the cell array region B1 simultaneously illustrates a section of the first memory string and a section of the second memory string, which are taken along an X-Z plane, but the first memory string and the second memory string may not be disposed on the same X-Z plane. The sectional view of the interconnection region B2 illustrates a section taken along a Y-Z plane.

Figure 6A:
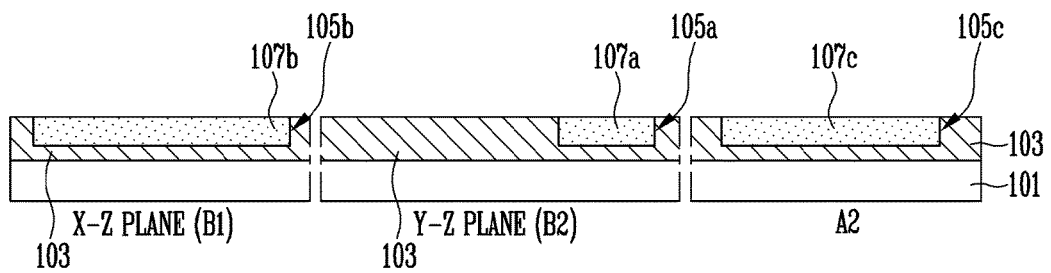
FIGS. 6A to 6L show sectional views illustrating a manufacturing method of the semiconductor device according to the embodiment of the present disclosure.

Referring to FIG. 6A, a first conductive layer 103 is formed on a lower structure 101. The lower structure 101 may include a substrate covered with a lower insulating layer. The lower structure 101 may include a plurality of driving transistors, routing lines, and contact plugs, which are covered with the lower insulating layer as described in FIG. 5. The first conductive layer 103 may be formed of a conductive material such as a poly-silicon layer.

Subsequently, first to third concave parts 105a, 105b, and 105c are formed in the first conductive layer 103 by etching the first conductive layer 103. The first concave part 105a may be disposed in the interconnection region B2, the second concave part 105b may be disposed in the cell array region B1, and the third concave part 105c may be disposed in the second region A2.

After this, the first to third concave parts 105a, 105b, and 105c are filled with first buried patterns 107a, 107b, and 107c. The first buried patterns 107a, 107b, and 107c include a first pattern 107a filling in the first concave part 105a, a second pattern 107b filling in the second concave part 105b, and a third pattern 107c filling in the third concave part 105c. The first buried patterns 107a, 107b, and 107c may be formed of a material having an etching rate different from that of the first conductive layer 103 and second to fourth conductive layers formed in subsequent processes. For example, the first buried patterns 107a, 107b, and 107c may be formed of a nitride layer.

Figure 6B:
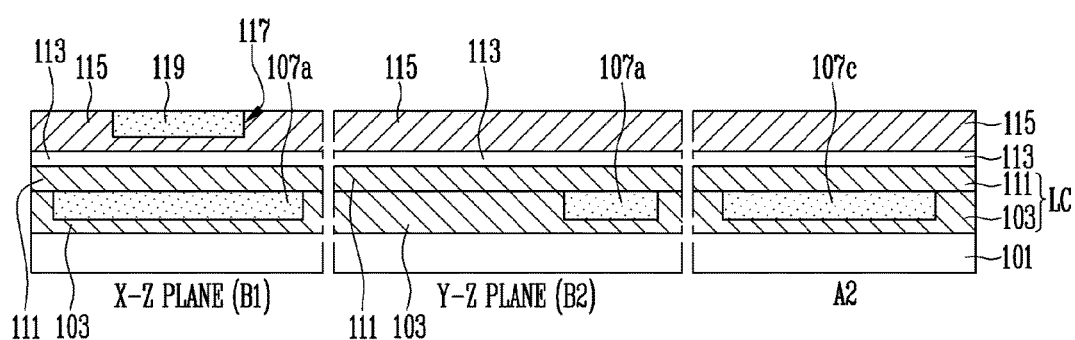

Referring to FIG. 6B, a second conductive layer 111 covering the first buried patterns 107a, 107b, and 107c is formed on the first conductive layer 103. The second conductive layer 111 may be formed of a conductive material such as poly-silicon. Accordingly, a lower conductive layer LC having the first buried patterns 107a, 107b, and 107c buried therein is formed.

After this, an insulating layer 113 is formed on the lower conductive layer LC. The insulating layer 113 may be formed of various insulating materials. For example, the insulating layer 113 may be formed of a silicon oxide layer. Subsequently, a third conductive layer 115 is formed on the insulating layer 113. The third conductive layer 115 may be formed of a conductive material such as a poly-silicon layer.

Continuously, a fourth concave part 117 is formed in the third conductive layer 115 by etching the third conductive layer 115. The fourth concave part 117 is disposed in the cell array region B1. The fourth concave part 117 is filled with a second buried pattern 119. The second buried pattern 119 may be formed of a material having an etching rate different from that of the first to third conductive layers 103, 111, and 115 and a fourth conductive layer formed in a subsequent process. For example, the second buried pattern 119 may be formed of the same material as the first buried patterns 107a, 107b, and 107c. More specifically, the second buried pattern 119 may be formed of a nitride layer.

Figure 6C:
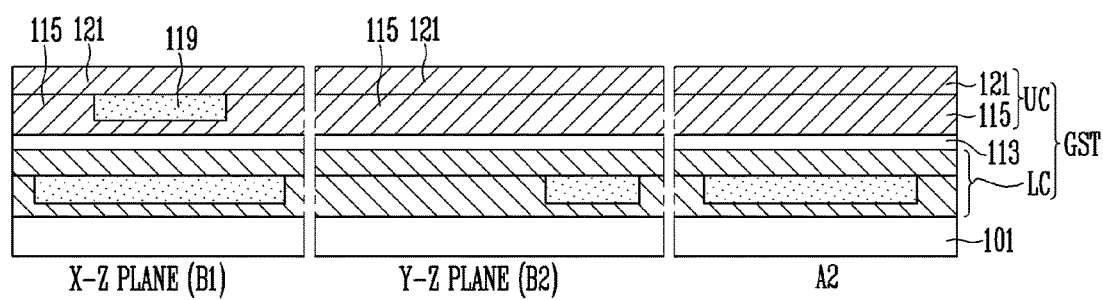

Referring to FIG. 6C, a fourth conductive layer 121 covering the second buried pattern 119 is formed on the third conductive layer 115. The fourth conductive layer 121 may be formed of a conductive material such as poly-silicon. Accordingly, an upper conductive layer UC having the second buried pattern 119 buried therein is formed.

According to the processes described in FIGS. 6A to 6C, a gate stack structure GST is formed on the lower structure 101. The gate stack structure GST includes the lower conductive layer LC, the insulating layer 113, and the upper conductive layer UC, which are sequentially stacked, and has the first buried patterns 107a, 107b, and 107c and the second buried pattern 119, which are buried therein.

Figure 6D:
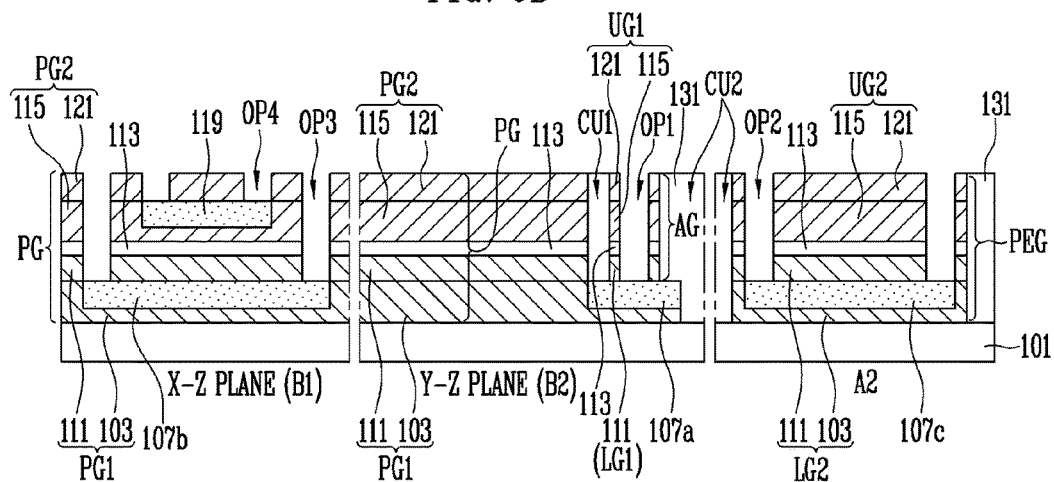

Referring to FIG. 6D, cutting structures CU1 and CU2 are formed, which separate the gate stack structure GST shown in FIG. 6C into a pipe gate stack structure PG, an auxiliary gate AG, and a peri gate PEG.

The forming of the cutting structures CU1 and CU2 may include: forming separation regions by etching at least one of the upper conductive layer including the third and fourth conductive layers 115 and 121 and the lower conductive layer including the first and second conductive layers 103 and 111; and filling the separation regions with an insulating material 131. The first buried patterns 107a, 107b, and 107c have an etching rate different from that of the first to fourth conductive layers 103, 111, 115, and 121. Thus, the first buried patterns 107a, 107b, and 107c can serve as etch stop layers in a process of etching the first to fourth conductive layers 103, 111, 115, and 121 for forming the separation regions.

The cutting structure CU1 and CU2 may include an auxiliary cutting structure CU1 for separating between the pipe gate stack structure PG and the auxiliary gate AG and a peri cutting structure CU2 for separating between the auxiliary gate AG and the peri gate PEG. The auxiliary cutting structure CU1 may overlap with the first pattern 107a among the first buried patterns 107a, 107b, and 107c. In particular, the auxiliary cutting structure CU1 may be disposed on only the first pattern 107a. A portion of the peri cutting structure CU2 may overlap with the first pattern 107a. The other portion of the peri cutting structure CU2 may extend to a region between the first pattern 107a and the third pattern 107c. The auxiliary cutting structure CU1 overlapping with the first pattern 107a and the portion of the peri cutting structure CU2, which overlaps with the first pattern 107a, do not penetrate the first pattern 107a. The first conductive layer 103 under the first pattern 107a is not cut by the cutting structures CU1 and CU2 but may remain as a portion of the pipe gate stack structure PG. The first conductive layer 103 between the first pattern 107a and the third pattern 107c is penetrated by the peri cutting structure CU2. Accordingly, the first conductive layer 103 may be separated into a first pipe gate PG1 overlapping with the first pattern 107a and a second lower conductive pattern LG2 of the peri gate PEG, which is spaced apart from the first pipe gate PG1.

The auxiliary gate AG may be configured with the second conductive layer 111, the insulating layer 113, the third conductive layer 115, and the fourth conductive layer 121, which remain between the cutting structures CU1 and CU2. The second conductive layer 111 remaining between the cutting structures CU1 and CU2 is defined as a first lower conductive pattern LG1 of the auxiliary gate AG, and the third and fourth conductive layers 115 and 121 remaining between the cutting structures CU1 and CU2 are defined as a first upper conductive pattern UG1 of the auxiliary gate AG. The auxiliary gate AG overlaps with the first pattern 107a.

The pipe gate stack structure PG is patterned to surround the second pattern 107b among the first buried patterns 107a, 107b, and 107c and the second buried pattern 119. The pipe gate stack structure PG includes the first pipe gate PG1, the insulating layer 113, and a second pipe gate PG2, which are isolated from the auxiliary gate AG by the auxiliary cutting structure CU1. The first pipe gate PG1 may be configured with the second conductive layer 111 isolated from the first lower conductive pattern LG1 of the auxiliary gate AG by the auxiliary cutting structure CU1 and the first conductive layer 103 isolated from the peri gate PEG by the peri cutting structure CU2. The first conductive layer 103 of the first pipe gate PG1 extends to be overlapped by the second conductive layer 111 of the first pipe gate PG1 and overlapped by the first pattern 107a. The second pattern 107b is buried in the first pipe gate PG1. The second pipe gate PG2 may be configured with the third and fourth conductive layers 115 and 121 isolated from the first upper conductive pattern UG1 of the auxiliary gate AG by the auxiliary cutting structure CU1. The second buried pattern 119 is buried in the second pipe gate PG2.

The peri gate PEG is patterned to surround the third pattern 107c among the first buried patterns 107a, 107b, and 107c. The peri gate PEG includes the second lower conductive pattern LG2, the insulating layer 113, and a second upper conductive pattern UG2, which are isolated from the auxiliary gate AG and the first conductive layer 103 of the first pipe gate PG1 by the peri cutting structure CU2. The second lower conductive pattern LG2 may include the first conductive layer 103 and the second conductive layer 111. The second lower conductive pattern LG2 is isolated from the first conductive layer 103 of the first pipe gate PG1 and the first lower conductive pattern LG1 of the auxiliary gate AG by the peri cutting structure CU2. The third pattern 107c is buried in the second lower conductive pattern LG2. The second upper conductive pattern UG2 may include the third conductive layer 115 and the fourth conductive layer 121. The second upper conductive pattern UG2 is isolated from the first upper conductive pattern UG1 of the auxiliary gate AG by the peri cutting structure CU2.

The pipe gate stack structure PG, the auxiliary gate AG, and at least one of the first to fourth conductive layers 103, 111, 151, and 121 and the insulating layer 113 of the peri gate PEG are penetrated by openings OP1 to OP4. The openings OP1 to OP4 include a first opening OP1 exposing the first pattern 107a, a second opening OP2 exposing the third pattern 107c, third openings OP3 exposing the second pattern 107b, and fourth openings OP4 exposing the second buried pattern 119.

The first opening OP1 may be formed by etching the auxiliary gate AG between the auxiliary cutting structure CU1 and the peri cutting structure CU2. The first opening OP1 exposes the first pattern 17a by penetrating the auxiliary gate AG. The first pattern 107a may serve as an etch stop layer while the auxiliary gate AG is being etched.

One or two or more second openings OP2 may be formed. The second opening OP2 may be formed by etching the peri gate PEG. The second opening OP2 exposes the third pattern 107c by penetrating the second upper conductive pattern UG2 of the peri gate PEG, the insulating layer 103, and the second conductive layer 111 of the second lower conductive pattern LG2. The third pattern 107c may serve as an etch stop layer while the second upper conductive pattern UG2 of the peri gate PEG, the insulating layer 103, and the second conductive layer 111 of the second lower conductive pattern LG2 are being etched.

The third openings OP3 may overlap with both ends of the second pattern 107b. The third openings OP3 may be formed by etching the pipe gate stack structure PG. The third openings OP3 expose the second pattern 107b by penetrating the second pipe gate PG2, the insulating layer 103, and the second conductive layer 111 of the first pipe gate PG1. The second pattern 107b may serve as an etch stop layer while the second pipe gate PG2, the insulating layer 103, and the second conductive layer 111 of the first pipe gate PG1 are being etched.

The fourth openings OP4 may overlap with both ends of the second buried pattern 119. The fourth openings OP4 may be formed by etching the pipe gate stack structure PG. The fourth openings OP4 expose the second buried pattern 119 by penetrating the fourth conductive layer 121 of the second pipe gate PG2. The second buried pattern 119 may serve as an etch stop layer while the fourth conductive layer 121 of the second pipe gate PG2 is being etched.

Figure 6E:
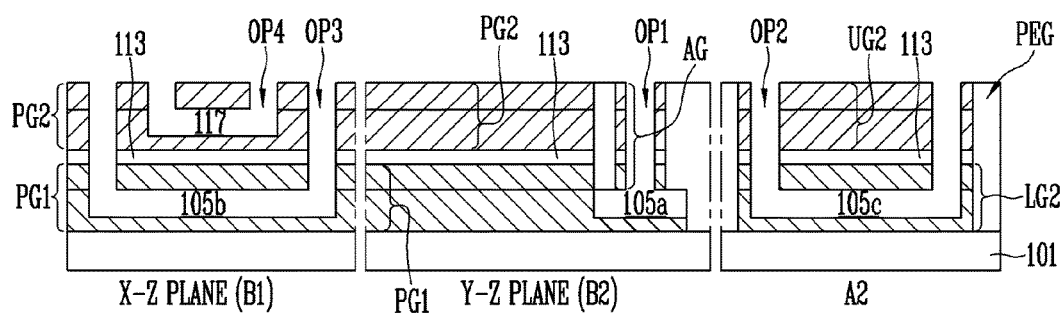

Referring to FIG. 6E, the first buried patterns 107a to 107c and the second buried pattern 119, which are shown in FIG. 6D, are removed through the openings OP1 to OP4. Accordingly, the first concave part 105a, the second concave part 105b, the third concave part 105c, and the fourth concave part 117 are opened.

Figure 6F:
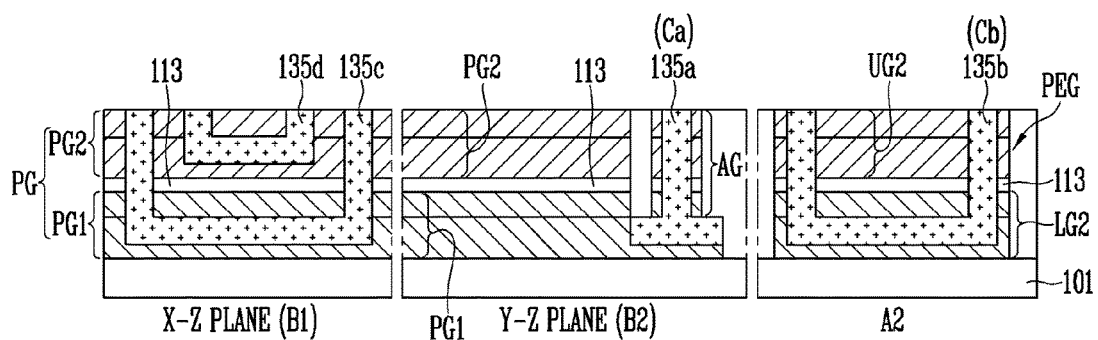

Referring to FIG. 6F, the openings OP1 to OP4, the first concave part 105a, the second concave part 105b, the third concave part 105c, and the fourth concave part 117, which are shown in FIG. 6E, are filled with a buried conductive material. The buried conductive material may be formed of a material having an etching rate different from those of first material layers and second material layers, which are formed in a subsequent process. For example, the buried conductive material may be formed of a titanium nitride layer (TiN). The buried conductive material may be planarized such that top surfaces of the second pipe gate PG2, the auxiliary gate AG, and the peri gate PEG are exposed. Through the series of processes described above, a buried conductive group is formed, which includes a first gate contact pattern 135a, a second gate contact pattern 135b, a first sacrificial conductive pattern 135c, and a second sacrificial conductive pattern 135d.

The first sacrificial conductive pattern 135c and the second sacrificial conductive pattern 135d are disposed in the pipe gate stack structure PG. More specifically, the first sacrificial conductive pattern 135c is a pattern filling in the third openings OP3 and the second concave part 105b, which are shown in FIG. 6E. The first sacrificial conductive pattern 135c penetrates the second pipe gate PG2 and the insulating layer 113 and extends to the inside of the first pipe gate PG1. The second sacrificial conductive pattern 135d is a pattern filling in the fourth openings OP4 and the fourth concave part 117, which are shown in FIG. 6E. The second sacrificial conductive pattern 135d is disposed in the second pipe gate PG2, and is formed shorter than the first sacrificial conductive pattern 135c.

The first gate contact patterns 135a is an auxiliary gate contact pattern Ca, and extends to the inside of the first pipe gate PG1 of the pipe gate stack structure PG from the inside of the auxiliary gate AG. More specifically, the auxiliary gate contact pattern Ca is a pattern filling in the first opening OP1 and the first concave part 105a, which are shown in FIG. 6E.

The second gate contact pattern 135b is a peri gate contact pattern Cb, and is disposed in the peri gate PEG. For example, the peri gate contact pattern Cb is a pattern filling in the second opening OP2 and the third concave part 105c, which are shown in FIG. 6E.

Figure 6G:
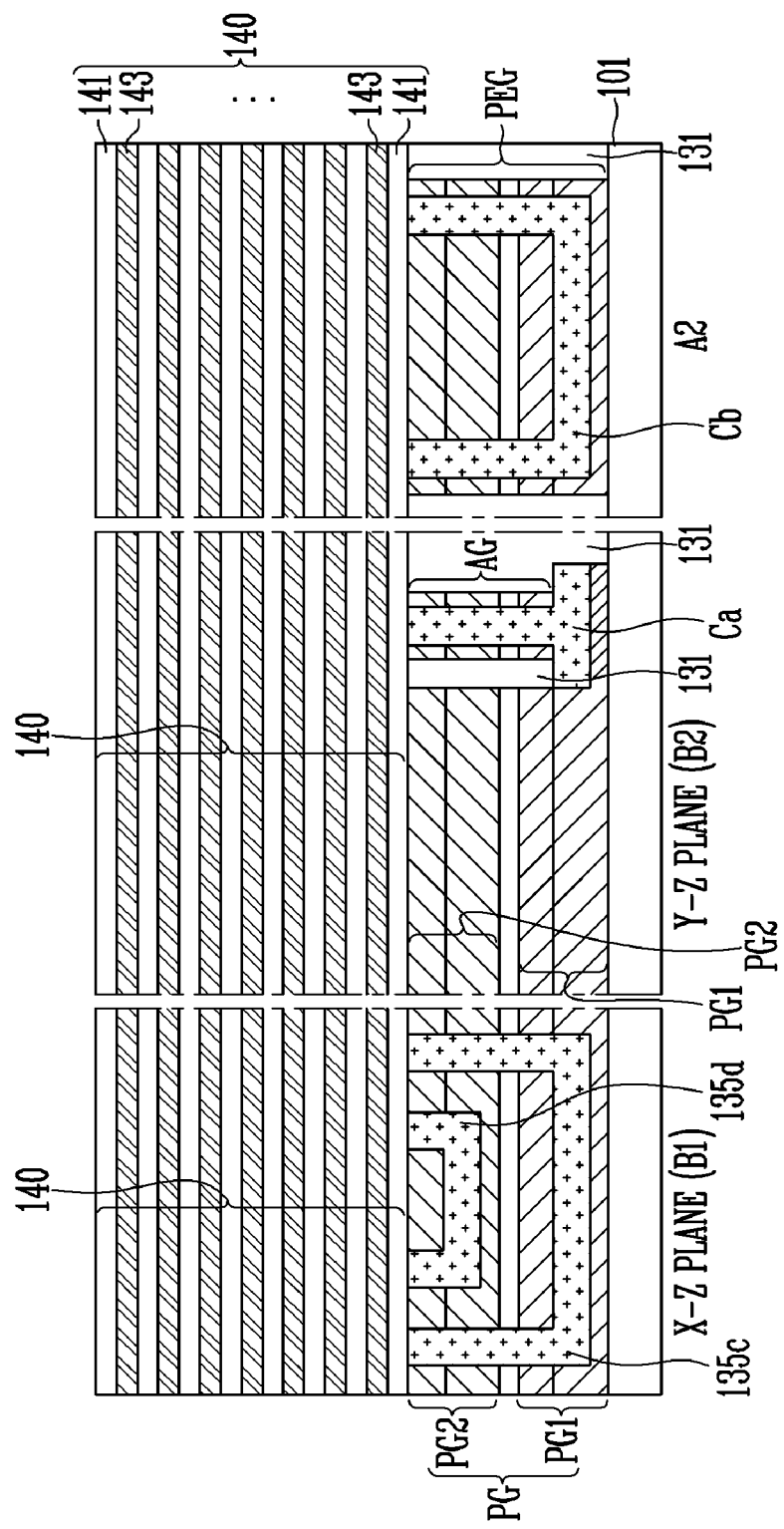

Referring to FIG. 6G, a preliminary stack structure 140 is formed on the pipe gate stack structure PG in which the first sacrificial conductive pattern 135c and the second sacrificial conductive pattern 135d are buried, the auxiliary gate AG in which the auxiliary gate contact pattern Ca is buried, and the peri gate PEG in which the peri gate contact pattern Cb is buried. The preliminary stack structure 140 includes first material layers 141 and second material layers 143, which are alternately stacked.

The first material layers 141 may be formed of a material different from that of the second material layers 143.

In a first case, the first material layers 141 may be formed of a first insulating material, and the second material layers 143 may be formed of a second insulating material for sacrificial layers, which has an etching rate different form that of the first material layers 141. The first insulating material may be selected among various materials that can serve as an interlayer insulating layer. For example, the first insulating material may include a silicon oxide layer. The second insulating material may be selected among various materials each having a large difference in etching rate between the second insulating material and the first insulating material. For example, the second insulating material may include a silicon nitride layer.

In a second case, the first material layers 141 may be formed of the above-described first insulating material, and the second material layers 143 may be formed of a conductive material. The conductive material may include at least one of a doped silicon layer, a metal silicide layer, and a metal layer. In order to achieve low-resistance wiring, a low-resistance metal such as tungsten may be used as the conductive material.

In a third case, the second material layers 143 may be formed of a gate conductive material, and the first material layers 141 may be formed of a sacrificial conductive material having an etching rate different from that of the second material layers 143. The gate conductive material may include at least one of a doped silicon layer, a metal silicide layer, and a metal layer. The sacrificial conductive material may be selected among various materials each having a difference in etching rate between the sacrificial conductive material and the gate conductive material. For example, the gate conductive material may be formed of a doped silicon layer, and the sacrificial conductive material may be formed of an undoped silicon layer.

Figure 6H:
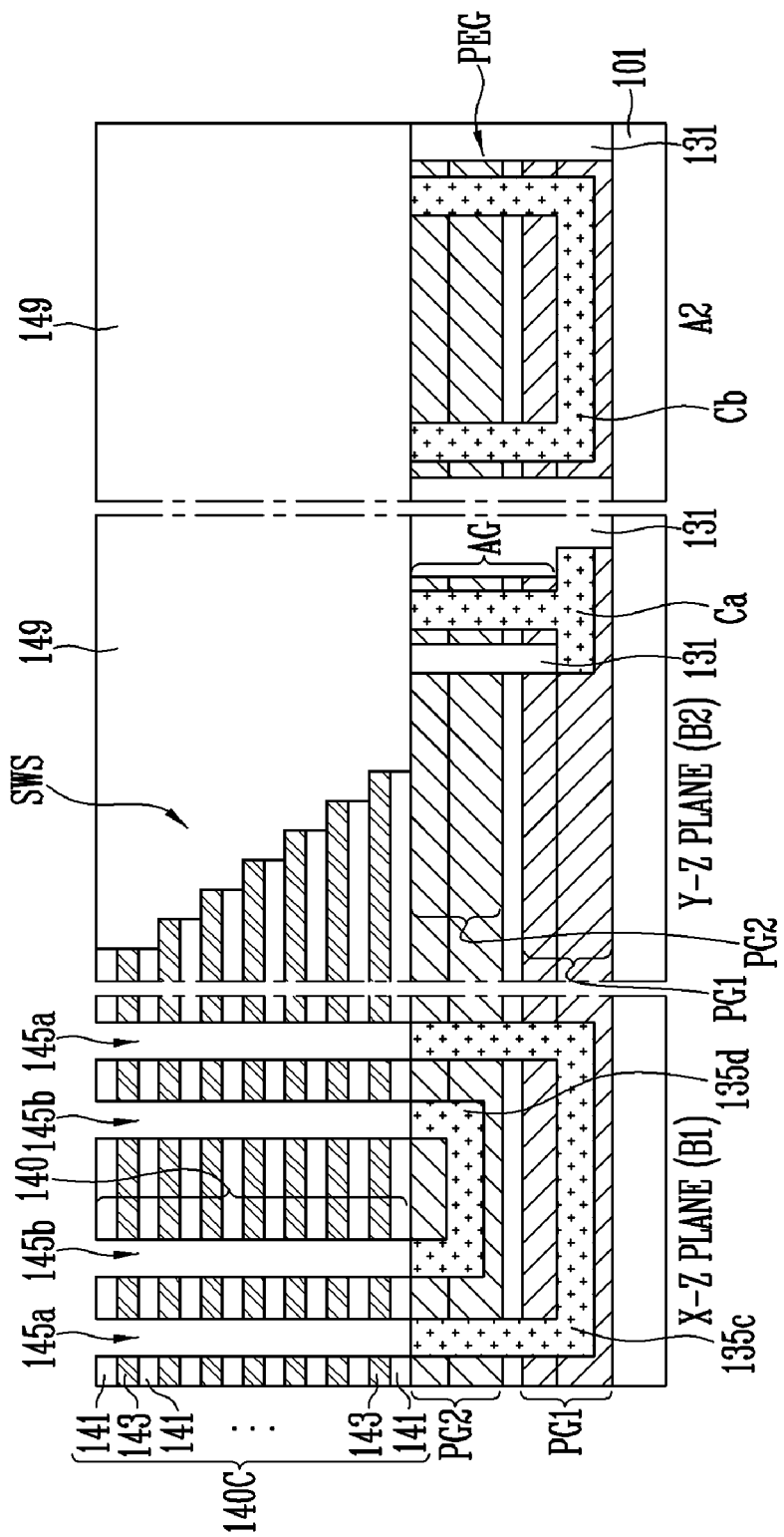

Referring to FIG. 6H, a cell stack structure 140C is formed by etching the preliminary stack structure 140. The cell stack structure 140C is disposed on the second pipe gate PG2. An end portion of the cell stack structure 140C may be patterned in a step structure SWS. Subsequently, an upper insulating layer 149 is formed, which covers the step structure SWS and has a flat surface. The cell stack structure 140C may be patterned such that an end portion of the second pipe gate PG2, the auxiliary gate AG, and the peri gate PEG are exposed.

Subsequently, holes 145a and 145b penetrating the first material layers 141 and the second material layers 143 are formed by etching the cell stack structure 140C. The holes 145a and 145b may include first holes 145a exposing the first sacrificial conductive pattern 135c and second holes 145b exposing the second sacrificial conductive pattern 135d. The first holes 145a may be patterned to expose both ends of the first sacrificial conductive pattern 135c, and the second holes 145b may be patterned to expose both ends of the second sacrificial conductive pattern 135d.

Figure 6I:
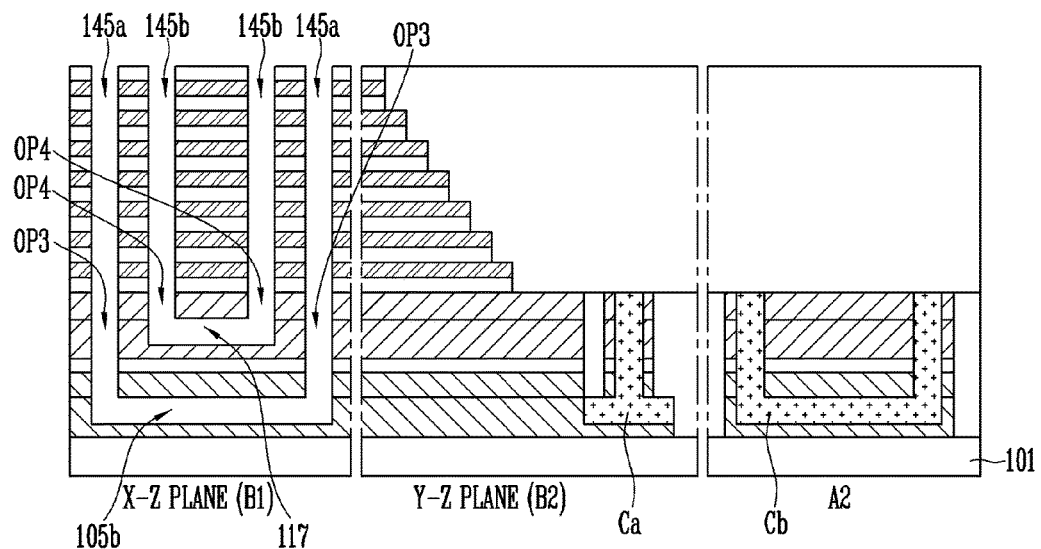

Referring to FIG. 6I, the first sacrificial conductive pattern 135c and the second sacrificial conductive pattern 135d, which are shown in FIG. 6H, are removed through the first holes 145a and the second holes 145b. Accordingly, the third openings OP3, the fourth openings OP4, the second concave part 105b, and the fourth concave part 117 are opened.

Figure 6J:
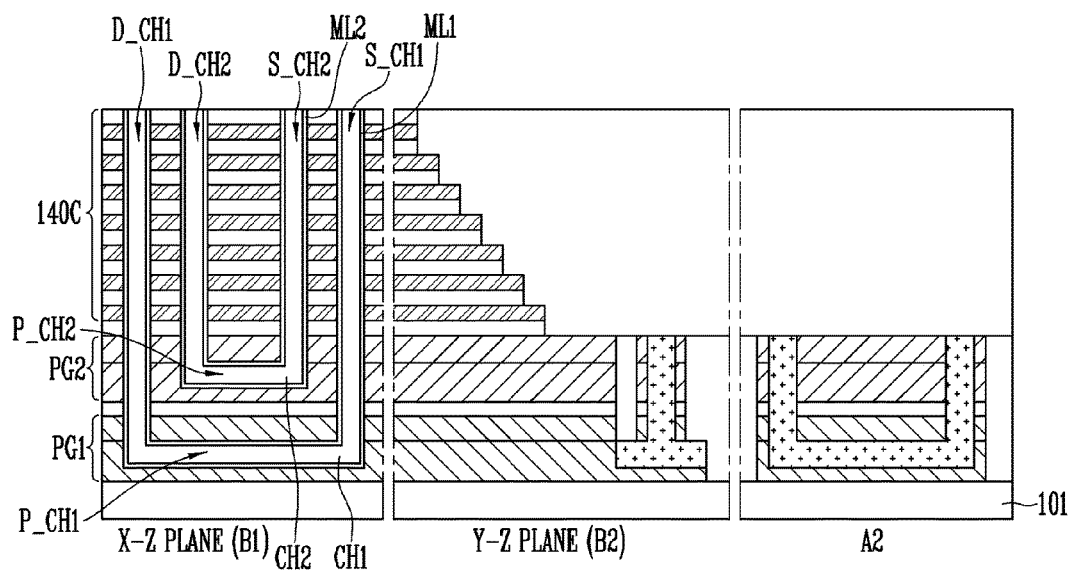

Referring to FIG. 6J, a first memory layer ML1 and a second memory layer ML2 are formed. The first memory layer ML1 extends along surfaces of the second concave part 105b, the third openings OP3, and the first holes 145a, which are shown in FIG. 6I. The second memory layer ML2 extends along surfaces of the fourth concave part 117, the second holes 145b, and the fourth openings OP4, which are shown in FIG. 6I. Each of the first memory layer ML1 and the second memory layer ML2 may include a charge blocking layer, a data storage layer, and a tunnel insulating layer. The data storage layer may be formed of various materials. For example, the data storage layer may be formed of a nitride layer in which charges can be trapped. In addition, the data storage layer may include silicon, a phase change material, nanodots, and the like. The charge blocking layer may include an oxide layer capable of blocking charges. The tunnel insulating layer may be formed of a silicon oxide layer in which charge tunneling is available.

Subsequently, a first channel layer CH1 and a second channel layer CH2 are formed. The first channel layer CH1 fills in the second concave part 105b, the third openings OP3, and the first holes 145a, which are shown in FIG. 6I, and is disposed on the first memory layer ML1. The second channel layer CH2 fills in the fourth concave part 117, the second holes 145b, and the fourth openings OP4, which are shown in FIG. 6I, and is disposed on the second memory layer ML2. The first and second channel layers CH1 and CH2 may be formed of a semiconductor layer such as silicon.

The first channel layer CH1 may be divided into a first pipe channel P_CH1, a first drain-side channel D_CH1, and a first source-side channel S_CH1. The first pipe channel P_CH1 is disposed in the first pipe gate PG1. The first drain-side channel D_CH1 extends from the first pipe channel P_CH1 to penetrate the second pipe channel PG2 and the cell stack structure 140C. The first source-side channel S_CH1 extends from the first pipe channel P_CH1 to penetrate the second pipe gate PG2 and the cell stack structure 140C, and is disposed in parallel to the first drain-side channel D_CH1.

The second channel layer CH2 may be divided into a second pipe channel P_CH2, a second drain-side channel D_CH2, and a second source-side channel S_CH2. The second pipe channel P_CH2 is disposed in the second pipe gate PG2. The second pipe channel P_CH2 is disposed upwards of the first pipe channel P_CH1, and both ends of the first pipe channel P_CH1 protrude farther laterally than those of the second pipe channel P_CH2. The second drain-side channel D_CH2 extends from the second pipe channel P_CH2 to penetrate the second pipe gate PG2 and the cell stack structure 140C. The second source-side channel S_CH2 extends from the second pipe channel P_CH2 to penetrate the second pipe gate PG2 and the cell stack structure 140C, and is disposed in parallel to the second drain-side channel D_CH2. The second drain-side channel D_CH2 and the second source-side channel S_CH2 may be disposed between the first drain-side channel D_CH1 and the first source-side channel S_CH1.

Figure 6K:
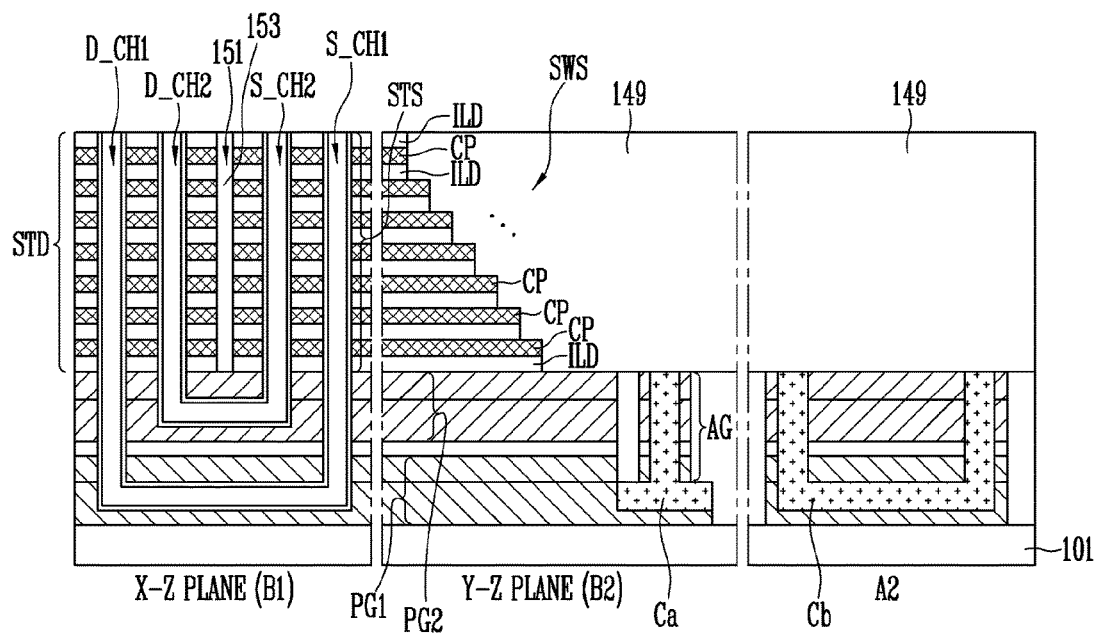

Referring to FIG. 6K, a slit 151 is formed between the second drain-side channel D_CH2 and the second source-side channel S_CH2. The slit 151 penetrates the cell stack structure 140C shown in FIG. 6J and separates the cell stack structure 140C into a drain-side stack structure STD and a source-side stack structure STS. After this, the slit 151 is filled with the insulating material 153. Since the second drain-side channel D_CH2 and the second source-side channel S_CH2 are disposed between the first drain-side channel D_CH1 and the first source-side channel S_CH1, it can be seen that the slit 151 is disposed between the first drain-side channel D_CH1 and the first source-side channel S_CH1.

According to materials constituting the first material layers and the second material layers of the cell stack structure 140C shown in FIG. 6J, a replace process may be further performed between the forming of the slit 151 and the forming of the insulating material 153. Alternatively, the replace process may be omitted.

As an example, like the first case described in FIG. 6G, the first material layers may be formed of a first insulating material, and the second material layers may be formed of a second insulating material for sacrificial layers. In the first case, the second insulating material for sacrificial layers may be replaced with conductive patterns CP through the slit 151. The conductive patterns CP may include at least one of a doped silicon layer, a metal silicide layer, and a metal layer. In order to achieve low-resistance wiring, the conductive patterns CP may be formed of a low-resistance metal such as tungsten. The first material layers may be patterned as interlayer insulating patterns ILD by the slit 151.

As another example, like the second case described in FIG. 6G, the first material layers may be formed of the first insulating material, and the second material layers may be formed of a conductive material. In the second case, the replace process may be omitted. In this case, the first material layers may be patterns as the interlayer insulating patterns ILD by the slit 151, and the second material layers may be patterned as the conductive patterns CP by the slit 151.

As still another example, like the third case described in FIG. 6G, the first material layers may be formed of a conductive material for sacrificial layers, and the second material layers may be formed of a gate conductive material. In the third case, the conductive material for sacrificial layers may be replaced with the interlayer insulating patterns ILD through the slit 151. The second material layers may be patterned as the conductive patterns CP by the slit 151.

Figure 6L:
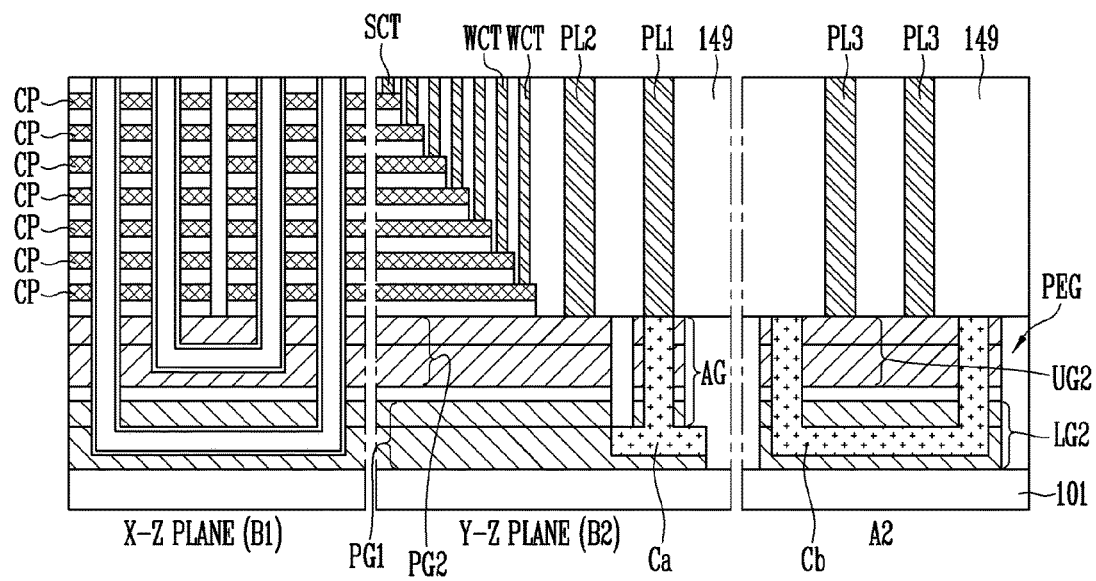

Referring to FIG. 6L, a contact group penetrating the upper insulating layer 149 is formed. The contact group includes word line contact plugs WCT, a select contact plug SCT, and first to third contact plugs PL1 to PL3. The word line contact plugs WCT extend to be in contact with word lines among the conductive patterns CP, and the select contact plug SCT extends to be in contact with a source select line or a drain select line among the conductive patterns CP. The first contact plug PL1 extends to be in contact with the auxiliary gate contact Ca, and may be electrically connected to the first pipe gate PG1 via the auxiliary gate contact Ca. The second contact plug PL2 extends to be in contact with the second pipe gate PG2. The third contact plug PL3 extends to be in contact with the second upper conductive pattern UG2 of the peri gate PEG.

As described above, according to an embodiment of the present disclosure, the first pipe gate connected to the first channel layer can be controlled separately from the second pipe gate.

According to an embodiment of the present disclosure, the first channel layer extends from the first pipe channel buried in the first pipe gate, and the second channel layer extends from the second pipe channel buried in the second pipe gate disposed above the second pipe gate. The degree of integration of memory cells connected to the first channel layer and the second channel layer can be improved using the arrangement of the first channel layer and the second channel layer.

The first channel layer is formed longer than the second channel layer. According to an embodiment of the present disclosure, the first pipe gate connected to the first channel layer can be individually controlled, and thus a difference in channel current, caused by the difference in length between the first channel layer and the second channel layer, can be reduced. Accordingly, in an embodiment of the present disclosure, it is possible to minimize the degradation of operational characteristics of the semiconductor device due to the difference in length between the first channel layer and the second channel layer.

Figure 7:
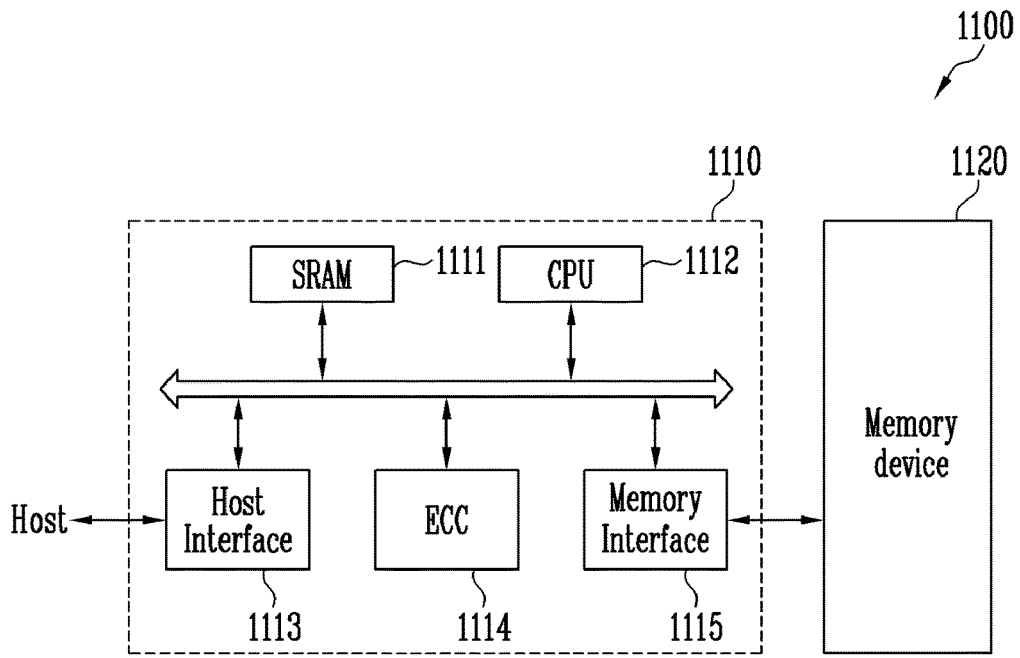
FIG. 7 is a block diagram illustrating a memory system including a memory device according to an embodiment of the present disclosure.

FIG. 7 is a block diagram illustrating a memory system including a memory device according to an embodiment of the present disclosure.

Referring to FIG. 7, the memory system 1100 according to the embodiment of the present disclosure includes a memory device 1120 and a memory controller 1110.

The memory device 1120 may include the structures described in FIGS. 1 to 5. For example, the memory device 1120 may include a pipe gate stack structure including a lower conductive layer in which a portion of a first channel layer is buried, an upper conductive layer in which a portion of a second channel layer is buried, the upper conductive layer being disposed above the lower conductive layer, and an insulating layer disposed between the upper conductive layer and the lower conductive layer. The lower conductive layer and the upper conductive layer of the pipe gate stack structure are respectively connected to a first contact structure and a second contact structure, and are insulated from each other through the insulating layer such that a signal can be individually applied thereto. In addition, the memory device 1120 may further include a peri gate. The peri gate is formed in a structure in which a lower conductive layer, an insulating layer, and an upper conductive layer are stacked, and is spaced apart from the pipe gate stack structure. The lower conductive layer and the upper conductive layer of the peri gate may be electrically connected to each other by a gate contact pattern buried in the peri gate.

The memory device 1120 may be a multi-chip package configured with a plurality of flash memory chips.

The memory controller 1110 is configured to control the memory device 1120 and may include a static random access memory (SRAM) 1111, a central processing unit (CPU) 1112, a host interface 1113, an error correction code (ECC) circuit 1114, and a memory interface 1115. The SRAM 1111 is used as an operation memory of the CPU 1112, the CPU 1112 performs overall control operations for data exchange of the memory controller 1110, and the host interface 1113 utilizes a data exchange protocol for a host connected with the memory system 1100. The ECC circuit 1114 detects and corrects errors included in data read from the memory device 1120, and the memory interface 1115 interfaces with the memory device 1120. In addition, the memory controller 1110 may further include ROM for storing code data for interfacing with the host and the like.

The memory system 1100 configured as described above may be a memory card or a solid state disk (SSD), in which the memory device 1120 is combined with the controller 1110. For example, when the memory system 1100 is an SSD, the memory controller 1100 may communicate with external devices (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 8:
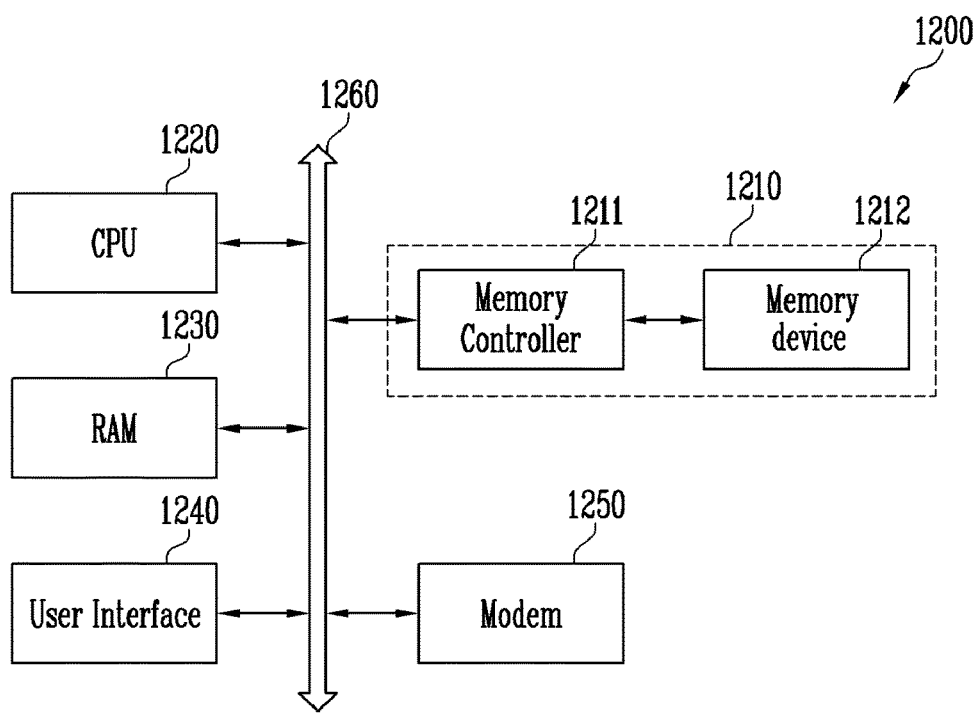
FIG. 8 is a block diagram illustrating a computing system including a memory system according to an embodiment of the present disclosure.

FIG. 8 is a block diagram illustrating a computing system including a memory system according to an embodiment of the present disclosure.

Referring to FIG. 8, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included. Additionally, an application chip set, a camera image processor (CIS), a mobile D-RAM, and the like may be further included.

The memory system 1210 may be configured with a memory device 1212 and a memory controller 1211. For some embodiments, the memory device 1212 and the memory controller 1211 correspond to the memory device 1120 and the memory controller 1110, respectively, of FIG. 7.

According to the present disclosure, the degree of integration of the memory cells can be improved by controlling the arrangement of the first channel layer and the second channel layer.

Further, according to the present disclosure, the first pipe gate connected to the first channel layer is insulated from the second pipe gate, so that the first pipe gate and the second pipe gate can be individually controlled.

Examples of embodiments have been disclosed herein, and although specific terms are employed, the terms are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A semiconductor device comprising:
a first pipe gate;
a second pipe gate disposed on the first pipe gate;
an inter-gate insulating layer disposed between the first pipe gate and the second pipe gate;
first memory cells and second memory cells, disposed on the second pipe gate;
a first channel layer extending toward the first memory cells from the inside of the first pipe gate, the first channel layer connecting the first memory cells in series;
a second channel layer extending toward the second memory cells from the inside of the second pipe gate, the second channel layer connecting the second memory cells in series;
a first contact structure connected to the first pipe gate; and
a second contact structure connected to the second pipe gate.

2. A semiconductor device comprising:
a pipe gate stack structure;
a first memory string including memory cells and a first pipe transistor coupled to each other in series via a first channel layer, the first pipe transistor formed at an intersection portion of the pipe gate stack structure and the first channel layer;
a second memory string including memory cells and a second pipe transistor coupled to each other in series via a second channel layer, the second pipe transistor formed at an intersection portion of the pipe gate stack structure and the second channel layer; and
first and second contact structures configured to individually control the first and second pipe transistors, respectively.

3. The semiconductor device of claim 2,
wherein the first contact structure is coupled to the first pipe transistor to provide a first control signal, and
wherein the second contact structure is coupled to the second pipe transistor to provide a second control signal different from the first control signal.

4. The semiconductor device of claim 2, wherein the pipe gate stack structure comprises:
a first pipe gate included the first pipe transistor; and
a second pipe gate disposed on the first pipe gate, and included the second pipe transistor.

5. The semiconductor device of claim 4, wherein the pipe gate stack structure comprises:
an inter-gate insulating layer disposed between the first pipe gate and the second pipe gate.

6. The semiconductor device of claim 4, wherein the first pipe gate includes a contact region that is not overlapped by the second pipe gate,
wherein the first contact structure includes:
a first gate contact pattern in contact with the contact region of the first pipe gate, the first gate contact pattern extending up to the height of a top surface of the second pipe gate; and
a contact plug disposed on the first gate contact pattern, the contact plug being in contact with the first gate contact pattern.

7. The semiconductor device of claim 6, wherein the first contact structure further includes an auxiliary gate disposed on the contact region of the first pipe gate, the auxiliary gate being penetrated by the first gate contact pattern, the auxiliary gate being spaced apart from the second pipe gate.

8. The semiconductor device of claim 7, wherein the first gate contact pattern includes:
a vertical part penetrating the auxiliary gate; and
a horizontal part extending from the vertical part to be disposed between the auxiliary gate and the first pipe gate.

9. The semiconductor device of claim 7,
wherein the pipe gate stack structure includes an inter-gate insulating layer disposed between the first pipe gate and the second pipe gate, and
wherein the auxiliary gate includes:
a first upper conductive pattern disposed on the same plane as the second pipe gate;
a first dummy insulating layer disposed on the same plane as the inter-gate insulating layer; and
a first lower conductive pattern disposed under the first upper conductive pattern with the first dummy insulating layer interposed between the first lower conductive pattern and the first upper conductive pattern.

10. The semiconductor device of claim 6, wherein the first pipe gate includes an overlapping region overlapped by the second pipe gate,
wherein the contact region of the first pipe gate has a thickness thinner than that of the overlapping region of the first pipe gate.

11. The semiconductor device of claim 10, wherein the first gate contact pattern extends to be in contact with a side all of the overlapping region of the first pipe gate.

12. The semiconductor device of claim 6,
wherein the pipe gate stack structure includes an inter-gate insulating layer disposed between the first pipe gate and the second pipe gate, and
further comprising a peri gate spaced apart from the first pipe gate,
wherein the peri gate includes:
a second lower conductive pattern disposed on the same plane as the first pipe gate;
a second dummy insulating layer disposed on the second lower conductive pattern, the second dummy insulating layer being disposed on the same plane as the inter-gate insulating layer; and
a second upper conductive pattern disposed on the second dummy insulating layer, the second upper conductive pattern being disposed on the same plane as the second pipe gate.

13. The semiconductor device of claim 12, further comprising a third contact structure connected to the peri gate,
wherein the third contact structure includes:
a second gate contact pattern buried in the peri gate, the second gate contact pattern connecting the second lower conductive pattern and the second upper conductive pattern; and
a contact plug disposed on the second upper conductive pattern, the contact plug being in contact with the second upper conductive pattern.

14. The semiconductor device of claim 13, wherein the second gate contact pattern includes:
a horizontal part buried in the second lower conductive pattern; and
a vertical part extending from the horizontal part to penetrate the second dummy insulating layer and the second upper conductive pattern.

15. The semiconductor device of claim 13, wherein different control signals are applied to the first to third contact structures.

16. A semiconductor device comprising:
a gate stack structure including a lower conductive layer, an insulating layer, and an upper conductive layer, which are sequentially staked in a first direction;
a portion of a first channel layer buried in the lower conductive layer, the first channel layer extending in the first direction to penetrate the insulating layer and the upper conductive layer;
a portion of a second channel layer buried in the upper conductive layer, the second channel layer extending in the first direction to penetrate the upper conductive layer;
a cutting structure penetrating the upper conductive layer such that the upper conductive layer is separated into an auxiliary gate and a pipe gate stack structure, the pipe gate stack structure shared by the first and second channel layers; and
a gate contact pattern penetrating the auxiliary gate, the gate contact pattern connecting the auxiliary gate to the lower conductive layer of the pipe gate stack structure.

17. The semiconductor device of claim 16, further comprising:
a first contact plug connected to the gate contact pattern and the auxiliary gate; and
a second contact plug connected to the upper conductive layer of the pipe gate stack structure.

18. The semiconductor device of claim 16, further comprising a drain-side stack structure and a source-side stack structure, disposed on the pipe gate stack structure, the drain-side stack structure and the source-side stack structure, being separated from each other,
wherein each of the drain-side stack structure and the source-side stack structure includes interlayer insulating patterns and conductive patterns, which are alternately stacked on the pipe gate stack structure,
wherein each of the first channel layer and the second channel layer includes a drain-side channel penetrating the drain-side stack structure and a source-side channel penetrating the source-side stack structure.

19. The semiconductor device of claim 16, wherein the gate contact pattern includes:
a vertical part penetrating the auxiliary gate; and
a horizontal part extending from the vertical part to be disposed on a lower surface of the auxiliary gate.

20. The semiconductor device of claim 19, wherein the horizontal part includes a top surface that protrudes further laterally than the auxiliary gate to form a common surface with a bottom surface of the cutting structure.

21. The semiconductor device of claim 19, wherein the cutting structure penetrates a portion of the lower conductive layer disposed on the horizontal part.

22. A semiconductor device comprising:
a gate stack structure including a lower conductive layer, an insulating layer, and an upper conductive layer, which are sequentially staked in a first direction;
a portion of a first channel layer buried in the lower conductive layer, the first channel layer extending in the first direction to penetrate the insulating layer and the upper conductive layer;
a portion of a second channel layer buried in the upper conductive layer, the second channel layer extending in the first direction to penetrate the upper conductive layer;
a peri cutting structure penetrating the gate stack structure such that the gate stack structure is separated into a peri gate and a pipe gate stack structure, the pipe gate stack structure shared by the first and second channel layers; and
a peri gate contact pattern buried in the peri gate, the peri gate contact pattern connecting the lower conductive layer and the upper conductive layer of the peri gate.

23. The semiconductor device of claim 22, further comprising:
an auxiliary cutting structure penetrating the upper conductive layer of the pipe gate stack structure such that the upper conductive layer is separated into an auxiliary gate and a pipe gate, the pipe gate shared by the first and second channel layers; and
an auxiliary gate contact pattern penetrating the auxiliary gate, the auxiliary gate contact pattern connecting the auxiliary gate and the lower conductive layer of the pipe gate stack structure.

24. The semiconductor device of claim 22, further comprising a contact plug connected to the upper conductive layer of the peri gate.

* * * * *